(12) United States Patent
Park et al.

(10) Patent No.: US 9,837,490 B2
(45) Date of Patent: Dec. 5, 2017

(54) SEMICONDUCTOR DEVICE WITH AIR GAP AND METHOD FOR FABRICATING THE SAME

(71) Applicant: SK hynix Inc., Gyeonggi-do (KR)

(72) Inventors: Hae-Jung Park, Gyeonggi-do (KR); Jung-Taik Cheong, Gyeonggi-do (KR); Tae-Woo Jung, Gyeonggi-do (KR); Yun-Je Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 182 days.

(21) Appl. No.: 14/994,238

(22) Filed: Jan. 13, 2016

(65) Prior Publication Data
US 2017/0005166 A1    Jan. 5, 2017

(30) Foreign Application Priority Data

Jun. 30, 2015    (KR) .................... 10-2015-0093512

(51) Int. Cl.
| H01L 29/06 | (2006.01) |
| H01L 23/528 | (2006.01) |
| H01L 23/532 | (2006.01) |
| H01L 21/768 | (2006.01) |
| H01L 21/762 | (2006.01) |
| H01L 29/66 | (2006.01) |

(52) U.S. Cl.
CPC ...... *H01L 29/0649* (2013.01); *H01L 21/7682* (2013.01); *H01L 21/76289* (2013.01); *H01L 23/528* (2013.01); *H01L 23/5329* (2013.01); *H01L 29/66621* (2013.01)

(58) Field of Classification Search
CPC .......... H01L 29/0649; H01L 29/66621; H01L 21/7682; H01L 21/76289
See application file for complete search history.

(56) References Cited

U.S. PATENT DOCUMENTS

| 2014/0077333 | A1 | 3/2014 | Son | |
| 2014/0110816 | A1 | 4/2014 | Kim et al. | |
| 2014/0175659 | A1* | 6/2014 | Lee | ........................ H01L 21/764 |
| | | | | 257/773 |
| 2015/0126013 | A1* | 5/2015 | Hwang | ............. H01L 27/10888 |
| | | | | 438/381 |
| 2016/0181143 | A1* | 6/2016 | Kwon | .................. H01L 27/1052 |
| | | | | 438/586 |
| 2017/0076974 | A1* | 3/2017 | Choi | ..................... H01L 23/498 |
| 2017/0154805 | A1* | 6/2017 | Kim | .................. G11C 11/40615 |

* cited by examiner

*Primary Examiner* — Joseph C Nicely
(74) *Attorney, Agent, or Firm* — IP & T Group LLP

(57) ABSTRACT

A semiconductor device may include: a substrate having first and second surfaces; an interlayer dielectric layer having a first opening to expose the first surface; a first plug positioned in the first opening and isolated from a sidewall of the first opening by a pair of gaps; a bit line extended in any one direction while covering the first plug; a second plug including a lower part adjacent to the first plug and an upper part adjacent to the bit line, and connected to the second surface; a first air gap positioned between the first plug and the lower part of the second plug; and a second air gap positioned between the bit line and the upper part of the second plug, and having a larger width than the first air gap.

10 Claims, 18 Drawing Sheets

SEMICONDUCTOR DEVICE WITH AIR GAP AND METHOD FOR FABRICATING THE SAME

CROSS-REFERENCE TO RELATED APPLICATIONS

The present application claims priority of Korean Patent Application No. 10-2015-0093512, filed on Jun. 30, 2015, which is herein incorporated by reference in its entirety.

BACKGROUND

1. Field

Exemplary embodiments of the present invention relate to a semiconductor device, and more particularly, to a semiconductor device with an air gap and a method for fabricating the same.

2. Description of the Related Art

In general, a semiconductor device includes a dielectric material formed between neighboring conductive structures. As the semiconductor device is highly integrated, the distance between the conductive structures is gradually reduced. Thus, parasitic capacitance increases. The increase in parasitic capacitance may degrade the performance of the semiconductor device.

In order to reduce the parasitic capacitance, the permittivity of the dielectric material may be lowered. However, since the dielectric material still has high permittivity, there is a limitation in reducing the parasitic capacitance.

SUMMARY

Various embodiments are directed to a semiconductor device capable of reducing parasitic capacitance between adjacent conductive structures.

In an embodiment, a semiconductor device may include: a substrate having first and second surfaces; an interlayer dielectric layer formed over the first surface and having a first opening to expose the first surface; a first plug positioned in the first opening; a bit line extending in a first direction and covering the first plug; a second plug may comprise a lower part and an upper part, The lower part may be at the same level as the first plug, The upper part may be at the same level as the bit line, a first air gap positioned between the first plug and the lower part of the second plug; and a second air gap positioned between the bit line and the upper part of the second plug, and The second air gap may have a larger width than the first air gap.

The second air gap may have a line shape extending in the first direction. The semiconductor device may further comprise: a plug isolation layer extending in a direction intersecting the bit line and providing a second opening which may be adjacent to the bit line and the first plug and exposes the second surface. The second plug may be positioned in the second opening. The semiconductor device may further comprise: a first spacer formed at both sidewalls of the bit line; and a second spacer surrounding a sidewall of the second plug, the second air gap may be positioned between the first spacer and the second spacer, and the second air gap may have a line shape extending in parallel to a sidewall of the first spacer. The semiconductor device may further comprise: a capping layer formed over the second air gap. Each of the first spacer, the second spacer, and the capping layer comprises silicon nitride. The semiconductor device may further comprise: a third plug over the second plug; and a barrier between the second and third plugs. The semiconductor device may further comprise: a pad formed over the third plug, the pad partially overlaps the third plug. The semiconductor device may further comprise: a memory element formed over the pad. The semiconductor device of may further comprise a buried word line formed in the substrate and extends in a direction intersecting the bit line.

In an embodiment, a method for fabricating a semiconductor device may include: forming a conductive structure over a substrate, the conductive structure including a first plug and a conductive line over the first plug; forming a dielectric plug at both sidewalls of the first plug, the dielectric plug including a sacrificial liner, the sacrificial liner having a first thickness; forming a spacer at both sidewalls of the conductive line, the spacer including a sacrificial spacer, the sacrificial spacer having a second thickness; forming a first air gap at the both sidewalls of the conductive line by removing the sacrificial spacer; and forming a second air gap at the both sidewalls of the first plug by removing a part of the sacrificial liner.

The second thickness of the sacrificial spacer may be larger than the first thickness of the sacrificial liner. The sacrificial spacer and the sacrificial liner may be formed of the same material. The sacrificial spacer and the sacrificial liner may be formed of silicon oxide. The spacer further includes a first spacer in contact with both sidewalls of the conductive structure, the sacrificial spacer may be formed over the first spacer, and the first spacer and the sacrificial spacer may be formed in parallel to both sidewalls of the conductive structure. The dielectric plug includes a liner in contact with both sidewalls of the first plug and a filler over the liner, and the sacrificial liner may be positioned between the liner and the filler. The first air gap may be formed in a line shape and in parallel to the both sidewalls of the conductive line.

The method of may further comprise: forming a second plug before the forming of the first air gap, the second plug includes a lower part and an upper part, the lower part may be adjacent to the first plug, the upper part may be adjacent to the conductive line, and the spacer and the dielectric plug may be between the upper part and the conductive line. The forming of the second plug may comprise: forming a sacrificial layer over the spacer; forming a pre-isolation part and a sacrificial layer pattern by selectively etching the sacrificial layer; forming a plug isolation layer to fill the pre-isolation part; forming a second opening by removing the sacrificial layer pattern; exposing the substrate under the second opening; forming a conductive layer to fill the second opening; and forming the second plug by recessing the conductive layer. The method may further comprise: forming a memory element coupled to the second plug, the conductive line includes a bit line.

The forming of the conductive structure comprises: forming an interlayer dielectric layer over the substrate; etching the interlayer dielectric layer and forming a first opening to expose a part of the substrate; recessing the substrate exposed by the first opening to a predetermined depth; forming a pre-first plug to fill the first opening; forming a conductive layer over the pre-first plug; forming the conductive line by etching the conductive layer; and forming the first plug and a gap at both sidewalls of the first plug by etching the pre-first plug, the first plug may have the same line width as the conductive line, the first air gap may be positioned in the gap.

The forming of the dielectric plug may comprises: forming a first spacer layer over to cover the both sidewalls of the conductive line and the both sidewalls of the first plug; forming a first sacrificial spacer layer over the first spacer layer by etching the sacrificial liner formed over first spacer layer; forming a pre-filer layer over the first sacrificial spacer layer so as to fill the gap; etching the pre-filler layer such that a filler may be left in the gap; and etching the first sacrificial spacer layer such that the sacrificial liner may be left in the gap.

The forming of the spacer may comprise: forming a second sacrificial spacer layer over the first spacer layer, the etched first sacrificial spacer layer and the filler; forming the second opening by etching the second sacrificial spacer layer to form the sacrificial spacer at a sidewall of the first spacer layer; forming a second spacer layer over the entire surface including the sacrificial spacer and the second opening; etching the second spacer layer to form a second spacer at a sidewall of the sacrificial spacer; and cutting the first spacer layer to form a first spacer at a sidewall of the bit line.

Each of the first and second spacers includes silicon nitride. The etching of the second sacrificial spacer layer may comprise: forming a third sacrificial spacer layer over the second sacrificial spacer layer; forming a plug isolation layer to provide a second opening, The second opening exposes the third sacrificial spacer layer; trimming the third sacrificial spacer layer to expose the second sacrificial spacer layer; and etching the second sacrificial spacer layer to form the sacrificial spacer.

The forming of the plug isolation layer may comprise: forming a sacrificial layer over the third sacrificial spacer layer; forming a pre-isolation part and a sacrificial layer pattern by selectively etching the sacrificial layer; forming the plug isolation layer to fill the pre-isolation part; and forming the second opening by removing the sacrificial layer pattern.

The trimming of the third sacrificial spacer layer may comprise: forming a re-capping layer on the entire surface of the resultant structure including the second opening; forming a first buffer layer over the re-capping layer; etching the first buffer layer and the re-capping layer to expose the third sacrificial spacer layer; and trimming the third sacrificial spacer layer to expose the second sacrificial spacer layer.

The etching of the second spacer layer may comprise: forming a second buffer layer over the second spacer layer; etching the second buffer layer to expose the second spacer layer; and etching the second spacer layer to form the second spacer.

DETAILED DESCRIPTION

Figure 1:
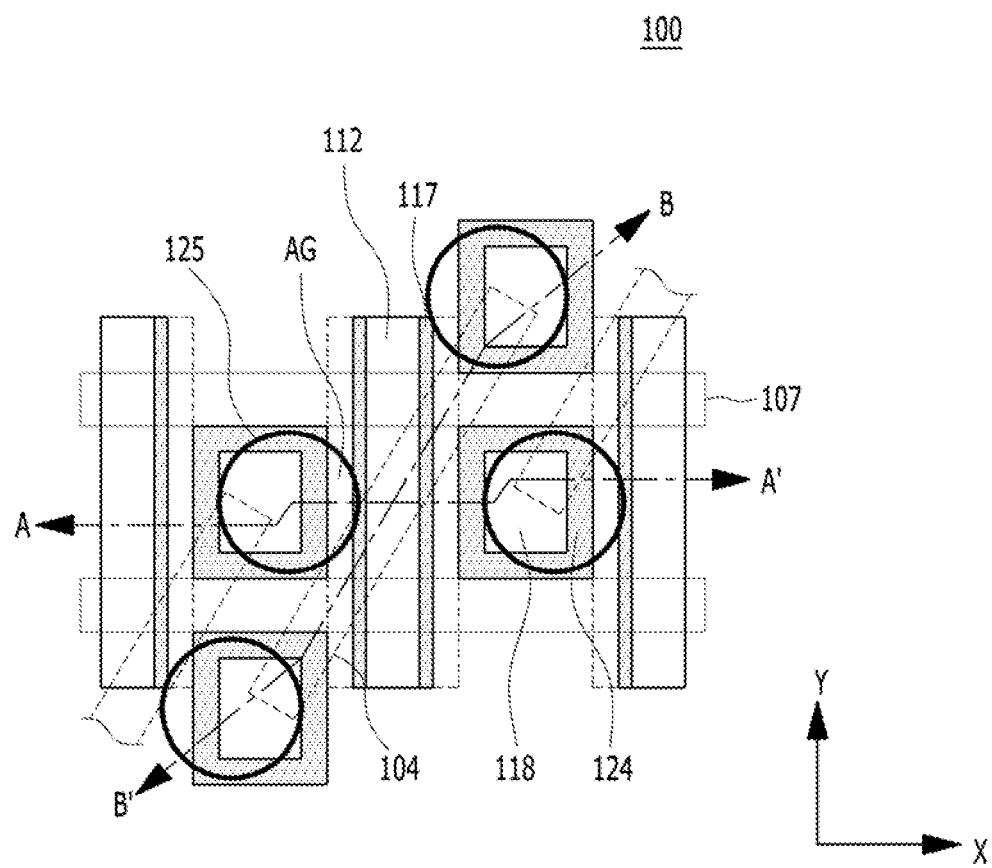
FIG. 1 illustrates a plan view of a semiconductor device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case in which a third layer exists between the first layer and the second layer or the substrate.

Figure 2A:
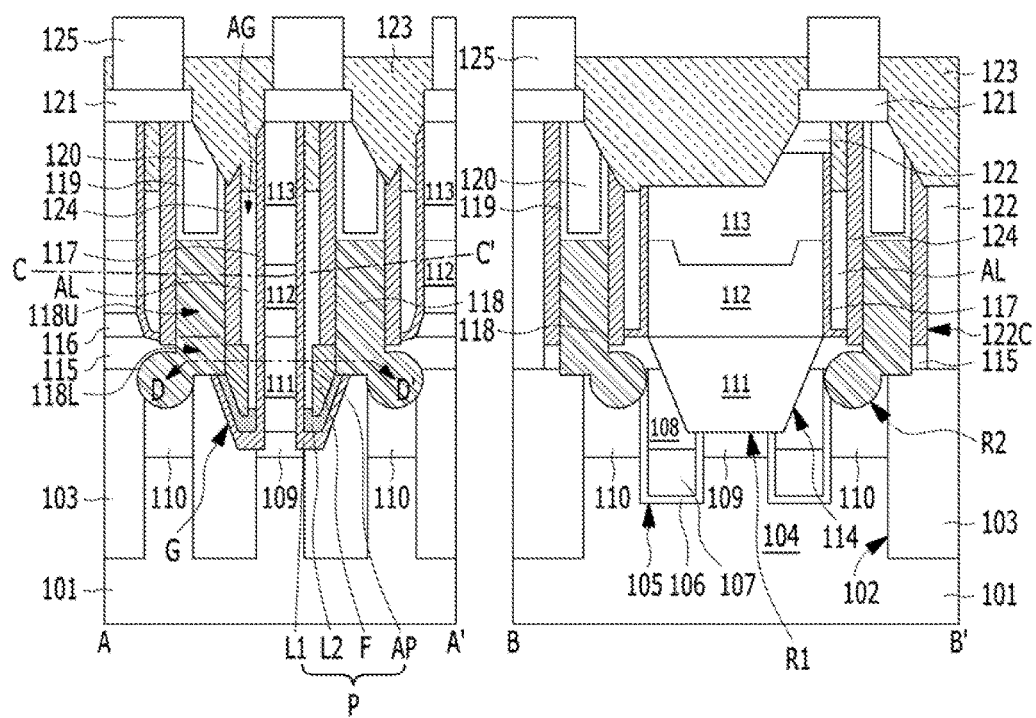
FIG. 2A illustrates a cross-sectional view taken along the line A-A' and the line B-B' of FIG. 1.
Figure 2B:
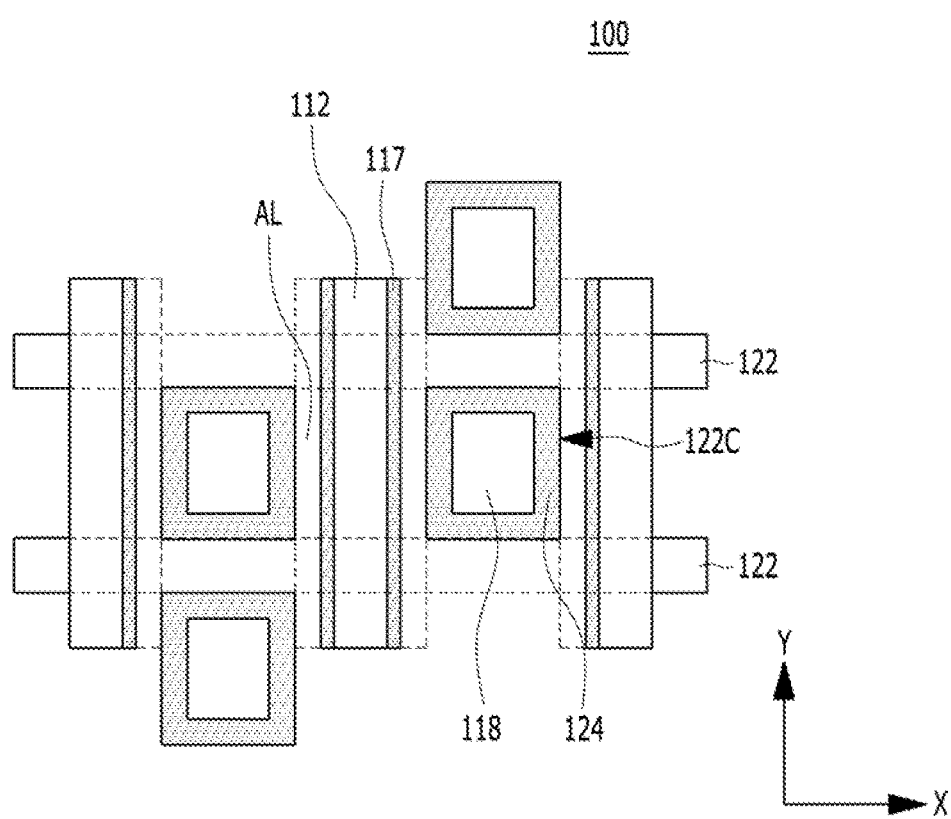
FIG. 2B illustrates an expanded plan view of a line-shaped air gap and taken along the line C-C' of FIG. 2A.
Figure 2C:
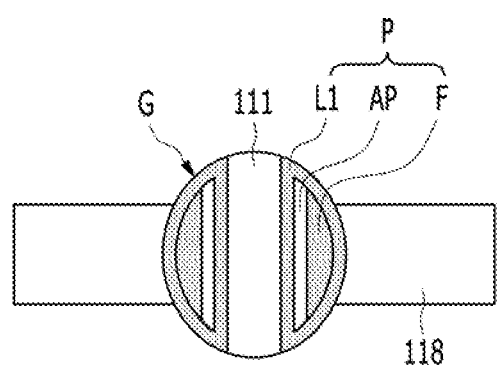
FIG. 2C illustrates an expanded plan view of a plug-shaped air gap and taken along the line D-D' of FIG. 2A.
Figure 2D:
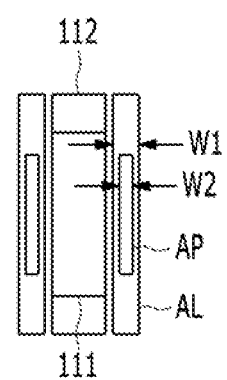
FIG. 2D is a diagram comparatively illustrating the widths of the line-shaped air gap and the plug-shaped air gap.

FIG. 1 is a plan view of a semiconductor device in accordance with an embodiment of the present invention. FIG. 2A is a cross-sectional view taken along line A-A' and line B-B' of FIG. 1. FIG. 2B is an expanded plan view of a line-shaped air gap and taken along the line C-C' of FIG. 2A. FIG. 2C is an expanded plan view of a plug-shaped air gap and taken along the line D-D' of FIG. 2A. FIG. 2D is a diagram comparatively illustrating the widths of the line-shaped air gap and the plug-shaped air gap.

The semiconductor device 100 may include a plurality of buried wordlines 107, a plurality of bit lines 112, and a memory element 125. The buried wordline 107 may be formed in a substrate 101. The buried wordline 107 may be extended in a first direction that is, X direction. The bit line 112 may be formed over the substrate 101. The buried wordline 107 and the bit line 112 may be arranged to intersect each other. The bit line 112 may be extended in a second direction that is, Y direction. Between the bit line 112 and the substrate 101, a first plug 111 may be formed. Between the memory element 125 and the substrate 101, a stacked structure of a second plug 118, a barrier 119, a third plug 120, and a pad 121 may be formed.

The second plug 118 may be positioned between the adjacent bit lines 112. The second plug 118 may include an upper part 118U adjacent to the bit line and a lower part 118L adjacent to the first plug 111. The second plug 118 may be positioned between the adjacent bit lines 112, and positioned between plug isolation layers 122. A first spacer 117 may be formed on the sidewalls of the bit line 112. A second spacer 124 may be formed adjacent to the first spacer 117. The first spacer 117 may have a line shape parallel to the sidewall of the bit line 112. The second spacer 124 may have a shape that surrounds the second plug 118.

Between the first and second plugs 111 and 118 and between the bit line 112 and the second plug 118, an air gap AG may be positioned. The air gap AG may include first and second air gaps AL and AP having different sizes. That is, the air gap AG may have a double air gap structure. The difference in size between the first and second air gaps AL and AP may indicate a width difference. The first air gap AL may have a first width W1, and the second air gap AP may have a second width W2 smaller than the first width (refer to FIG. 2D). Hereafter, for convenience of description, the first air gap AL will be referred to as a line-shaped air gap AL, and the second air gap AP will be referred to as a plug-shaped air gap AP.

The line-shaped air gap AL may be formed between the bit line 112 and the upper part 118U of the second plug 118. The plug-shaped air gap AP may be formed between the first plug 111 and the lower part 118L of the second plug 118. The plug-shaped air gap AP may be positioned at both sidewalls of the first plug 111. The first spacer 117 may be formed on both sidewalls of the bit line 112 and extended to both sidewalls of the first plug 111. The semiconductor device 100 will be described in detail.

An element isolation layer 103 may be formed in the substrate 101. The element isolation layer 130 may be formed in an isolation trench 102. The element isolation layer 103A may define a plurality of active regions 104.

A gate trench 105 may be formed to cross the active region 104 and the element isolation layer 103. A gate dielectric layer 106 may be formed on the surface of the gate trench 105. The buried wordline 107 may be formed on the gate dielectric layer 106 so as to fill a part of the gate trench 105. A sealing layer 108 may be formed over the buried wordline 107. The active region 104 may include first and second impurity regions 109 and 110 formed therein.

The first plug 111 may be formed over the substrate 101. The substrate 101 may have a recessed first surface R1, and the first plug 111 may be formed on the recessed first surface R1. The first plug 111 may be connected to the first impurity region 109. The first plug 111 may be positioned in a first opening 114. The first opening 114 may be formed in an interlayer dielectric layer 115. The interlayer dielectric layer 115 may be formed over the substrate 101. The first opening 114 may serve as a contact hole to expose the first impurity region 109. The first plug 111 may be referred to as a bit line contact plug. A gap G may be formed at both sides of the first plug 111 and the first opening 114. The first opening 114 may be filled with the first plug 111 and a dielectric plug P.

The dielectric plug P may fill the gap G. The dielectric plug P may include a first liner L1, a second liner L2, a filler F, and the plug-shaped air gap AP. Although described below, the second liner L2 may be partially removed to form the plug-shaped air gap AP. Thus, the second liner L2 may partially line the gap G. The first liner L1 may cover the bottom surface and side surfaces of the gap G. The second liner L2 may partially line the first liner L1. The filler F may be positioned over the second liner L2 in the gap G. The plug-shaped air gap AP may be positioned at a first side surface of the filler F, and the second liner L2 may be positioned at the bottom and a second side surface of the filler F. The plug-shaped air gap AP may be positioned between the first liner L1 and the filler F.

The bit line 112 may be formed over the first plug 111. A bit line hard mask 113 may be formed over the bit line 112. The first plug 111, the bit line 112, and the bit line hard mask 113, in combination, may be referred to as a bit line structure. The bit line structure may also be referred to as a conductive structure, and the bit line 112 may also be referred to as a conductive line.

The bit line 112 may have a line shape extended in a direction intersecting the buried wordline 107. A part of the bit line 112 may be connected to the first plug 111. The bit line 112 and the first plug 111 may have the same line width. Thus, the bit line 112 may be extended in a first direction while covering the top surface of the first plug 111. A part of the bit line 112 may be positioned and extended over an etch stop layer 116. The etch stop layer 116 may be formed over the Interlayer dielectric layer 115, formed in a line shape, and have the same line width as the bit line 112.

A dielectric structure including the first spacer 117 and the line-shaped air gap AL may be formed at both sidewalls of the bit line 112. The line-shaped air gap AL may have a shape extended in parallel to both sidewalls of the bit line 112. The first spacer 117 may be extended to line the gap G and the sidewalls of the first plug 111. The extension of the first spacer 117 may serve as the first liner L1 of the dielectric plug P.

Between the bit line structures, a storage node contact plug may be formed. The storage node contact plug may be connected to the second impurity region 110. The storage node contact plug may include the second plug 118, a barrier 119, and a third plug 120. The second plug 118 may be formed in a second opening 122C. The second spacer 124 may have the shape of surrounding the sidewalls of the storage node contact plug 118, 119, and 120.

The substrate 101 may have a recessed second surface R2, and the second plug 118 may be formed on the second surface R2. The second opening 122C may serve as a contact hole to expose the second impurity region 110. The second plug 118 is a silicon plug including polysilicon. The third plug 120 is a metal plug including tungsten. The barrier 119 may be formed between the second plug 118 and the third plug 120.

The pad 121 may be formed over the third plug 120. A part of the pad 121 may overlap the top of the bit line structure. Thus, an overlap margin of the memory element 125 can be secured. When seen from the extending direction of the bit line 112, the adjacent storage node contact plugs may be isolated by the plug isolation layer 122.

The air gap AG may be formed at both sidewalls of the bit line structure. The air gap AG may include the plug-shaped air gap AP and the line-shaped air gap AL. The plug-shaped air gap AP may be positioned at both sidewalls of the first plug 111. The plug-shaped air gap AP may be embedded in the gap G. The line-shaped air gap AL may be extended in parallel to both sidewalls of the bit line 112. The line-shaped air gap AL and the plug-shaped air gap AP may be connected to each other. The plug-shaped air gap AP may be positioned between the first plug 111 and the lower part 118L of the second plug 118, and the line-shaped air gap AL may be positioned between the bit line 112 and the upper part 118U of the second plug 118.

The top of the air gap AG may be capped by a capping layer 123. The capping layer 123 may cover the pad 121. The pad 121 may be electrically coupled to the memory element 125. The memory element 125 may include a capacitor having a storage node. In another embodiment, memory elements implemented in various manners may be coupled over the pad 121.

According to the above-described structure, the semiconductor device 100 may include a transistor including the buried wordline 107, the bit line 112, and the memory element 125. The substrate 101 and the bit line 112 may be electrically coupled through the first plug 111. The first plug 111 and the bit line 112 may be adjacent to the second plug 118.

Between the second plug 118 and the bit line 112, the line-shaped air gap AL may be formed. Thus, parasitic capacitance between the bit line 112 and the second plug 118 may be reduced. Furthermore, the plug-shaped air gap AP may be formed between the first plug 111 and the second plug 118. Thus, parasitic capacitance between the first plug 111 and the second plug 118 may be reduced.

When the first spacer 117 and the second spacer 124 include silicon nitride, a nitride-AL-nitride structure may be formed between the bit line 112 and the second plug 118. When the first liner L1 and the filler F include silicon nitride, a nitride-AP-nitride structure may be formed between the first plug 111 and the second plug 118.

In accordance with the embodiment of the present invention, the plug-shaped air gap AP may be formed between the first plug 111 and the second plug 118 at the same time as the line-shaped air gap AL is formed between the bit line 112 and the second plug 118, thereby reducing parasitic capacitance. In particular, since the sizes of the line-shaped air gap AL and the plug-shaped air gap AP can be adjusted, the total parasitic capacitance may be more easily reduced. Thus, the operating speed of the memory cell can be further improved.

In a comparative example of the present embodiment, the air gap may be formed only between the bit line and the second plug. In another comparative example of the present embodiment, the air gap may be formed only between the first plug and the second plug. However, since the parasitic capacitance reduction effects of the comparative examples are lower than that of the present embodiment, the comparative examples have a limitation in improving the operating speed of the memory cell.

In another comparative example of the present embodiment, the line-shaped air gap and the plug-shaped air gap may be formed to have the same width. That is, a single sacrificial material may be used to form the line-shaped air gap and the plug-shaped air gap at the same time. In the comparative example, however, when the size of the first opening having the first plug formed therein is reduced, the thickness of the sacrificial material may be reduced. Thus, the size of the air gap may be reduced at the same time. Therefore, the comparative example has a limitation in reducing parasitic capacitance.

Hereafter, a method for fabricating the semiconductor device which is viewed from the A-A' line and the B-B' line of FIG. 1 will be described. For convenience of description, the method for fabricating the semiconductor device will be divided in a bit line fabrication part, a storage node contact plug fabrication part, and an air gap fabrication part.

Figure 3A:
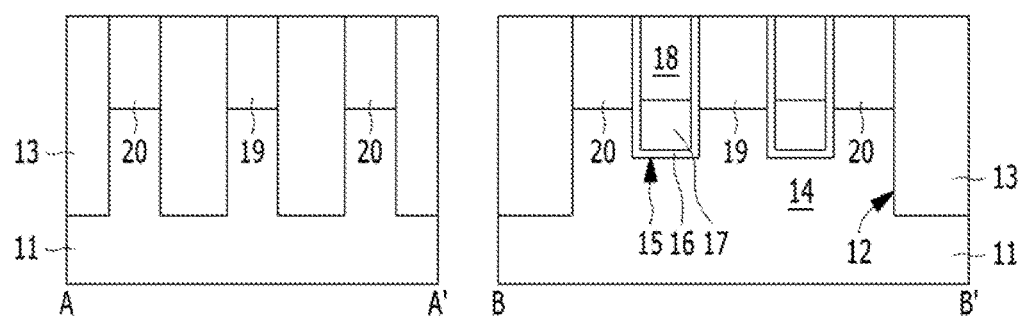
FIGS. 3A to 3I are diagrams for describing a bit line fabrication part.

FIGS. 3A to 3I are diagrams for describing the bit line fabrication part. As illustrated in FIG. 3A, an element isolation layer 13 may be formed in a substrate 11. The substrate 11 may include a material suitable for semiconductor processing. The substrate 11 may include a semiconductor substrate. The substrate 11 may include a silicon substrate, silicon-germanium substrate, or Silicon On Insulator ("SOI") substrate.

The substrate 11 may include a memory cell region and a peripheral circuit region. The element isolation layer 13 may be formed through Shallow Trench Isolation ("STI"). The element isolation layer 13 may be formed in an isolation trench 12. The element isolation layer 13 may define a plurality of active regions 14. The active region 14 may be formed in an island shape having the minor axis and the major axis. The plurality of active regions 14 may be isolated by the element isolation layer 13. The element isolation layer 13 may be formed of silicon nitride, silicon oxide, or a combination thereof.

A transistor including a buried wordline 17 may be formed in the memory cell region of the substrate 11. The buried wordline 17 may be buried in the substrate 11. The buried wordline 17 may be formed in a gate trench 15. The gate trench 15 having a predetermined depth may be formed in the substrate 11. The gate trench 15 may have a smaller depth than the isolation trench 12. The gate trench 15 may have a line shape extended in any one direction. The gate trench 15 may be formed by etching the active region 14 and the element isolation layer 13. The gate trench 15 may have the shape of crossing the active region 14 and the element isolation layer 13. A part of the gate trench 15 may be formed in the active region 14, and the other part of the gate trench 15 may be formed in the element isolation layer 13. In another embodiment, the other part of the gate trench 15, formed in the element isolation layer 13, may have a larger depth than the part of the gate trench 15, formed in the active region 14. Thus, a pin (not illustrated) may be formed in the active region 14.

A gate dielectric layer 16 may be formed on the surface of the gate trench 15. The gate dielectric layer 16 may be formed through thermal oxidation. In another embodiment, the gate dielectric layer 16 may be formed through Chemical Vapor Deposition ("CVD") or Atomic Layer Deposition ("ALD"). The gate dielectric layer 16 may include a high-k dielectric material, oxide, nitride, oxynitride, or a combination thereof. The high-k dielectric material may include a dielectric material having a higher dielectric constant than oxide and nitride. For example, the high-k dielectric material may include metal oxide such as hafnium oxide and aluminum oxide.

The buried wordline 17 may be formed over the gate dielectric layer 16. A sealing layer 18 may be formed over the buried wordline 17. The buried wordline 17 may be recessed to a lower level than the surface of the substrate 11. The buried wordline 17 may be formed through a process of forming a metal containing layer to gap-fill the gate trench 15 and then etching back the metal containing layer.

The metal containing layer may include a material containing titanium, tantalum, or tungsten as a main component. For example, the metal containing layer may include tantalum nitride (TaN), titanium nitride (TIN), tungsten nitride (WN), tungsten (W), or a combination thereof. For example, the buried wordline 17 may have a two-story structure such as TIN/W, in which W is stacked over TiN. In another embodiment, the buried wordline 17 may include a work function metal layer.

The sealing layer 18 may fill the gate trench 15 over the buried wordline 17. The sealing layer 18 may serve to protect the buried wordline 17 from a subsequent process. The sealing layer 18 may include a dielectric material. The sealing layer 18 may include silicon nitride, silicon oxide, or a combination thereof.

After the sealing layer 18 is formed, a first impurity region 19 and a second impurity region 20 may be formed in the active region 14. The first impurity region 19 and the second impurity region 20 may be formed by a doping process such as an implant process. The first and second impurity regions 19 and 20 may be doped with impurities having the same conductive type, for example, N-type impurities. The first and second impurity regions 19 and 20 may be referred to as source and drain regions, respectively. Thus, a buried gate-type transistor including the buried wordline 17 may be formed in the memory cell region.

Figure 3B:
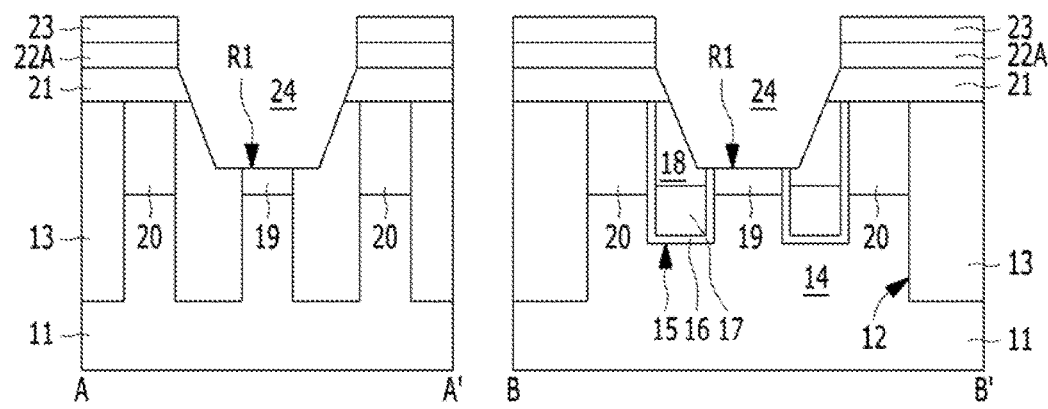

As illustrated in FIG. 3B, a first interlayer dielectric layer 21 may be formed over the substrate 11. An etch stop layer 22A may be formed over the first interlayer dielectric layer 21. The first interlayer dielectric layer 21 may include silicon oxide, silicon nitride, or a combination thereof. In the present embodiment, the etch stop layer 22A may include silicon nitride.

A first opening 24 may be formed. The first opening 24 may be formed by etching the etch stop layer 22A and the first interlayer dielectric layer 21 using a first mask pattern 23 as an etch mask. The first mask pattern 23 may include a photoresist pattern. The first opening 24 may have a hole shape when seen from the top. The substrate 11 may be partially exposed through the first opening 24.

The first opening 24 may have a diameter controlled to a predetermined line width. The first opening 24 may have a circular or elliptical shape. The first opening 24 may have the shape of exposing a part of the active region 14 between the buried wordlines 17. For example, the first impurity region 19 may be exposed through the first opening 24. The first opening 24 may be referred to as a contact hole. The first opening 24 may have a larger diameter than the width of the minor axis of the active region 14. Thus, the element isolation layer 13 and the sealing layer 18 around the first impurity region 19 may also be exposed through the first opening 24.

The first impurity region 19 exposed by the first opening 24 may be recessed to a predetermined depth. This may be referred to as a first recess R1. The element isolation layer 13 and the sealing layer 18, which are adjacent to the first impurity region 19, as well as the first impurity region 19 may also be partially recessed. The first recess R1 may be connected to the first opening 24. The top surfaces of the first impurity region 19, the element isolation layer 13, and the sealing layer 18, which are exposed by the first recess R1, may be at a lower level than the top surface of the substrate 11. When the first recess R1 is formed, the entrance of the first opening 24 may be rounded and widened.

Figure 3C:
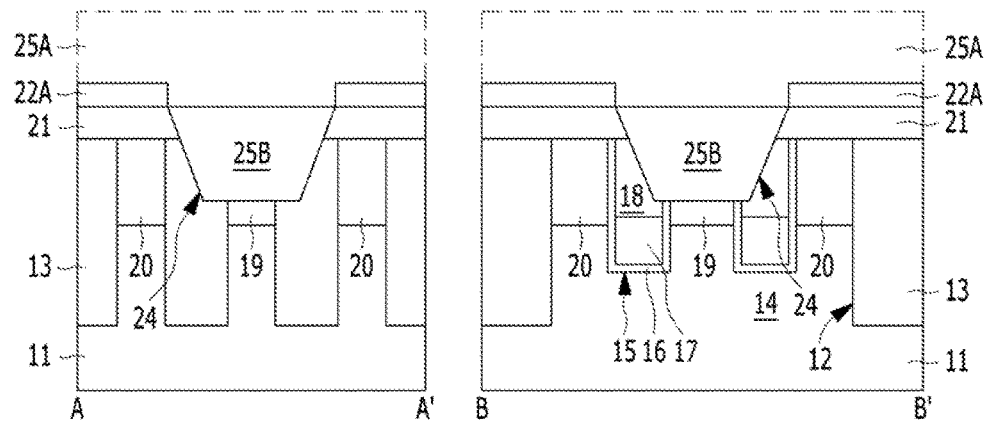

As illustrated in FIG. 3C, the first mask pattern 23 may be removed. Then, a pre-first plug 25B may be formed. The pre-first plug 25B may be formed through the following method. First, a plug layer 25A may be formed on the entire surface of the resultant structure including the first opening 24, and fill the first opening 24. Then, the plug layer 25A may be planarized to expose the surface of the etch stop layer 22A. Thus, the pre-first plug 25B filling the first opening 24 may be formed. The surface of the pre-first plug 25B may be at the same level as or a lower level than the surface of the etch stop layer 22A.

Subsequently, the pre-first plug 25B may be doped with an impurity through a doping process such as an implant process. In the present embodiment, the pre-first plug 25B may include polysilicon. In another embodiment, the pre-first plug 25B may be formed of a metal containing material. The pre-first plug 255 may be in contact with the first impurity region 19.

Figure 3D:
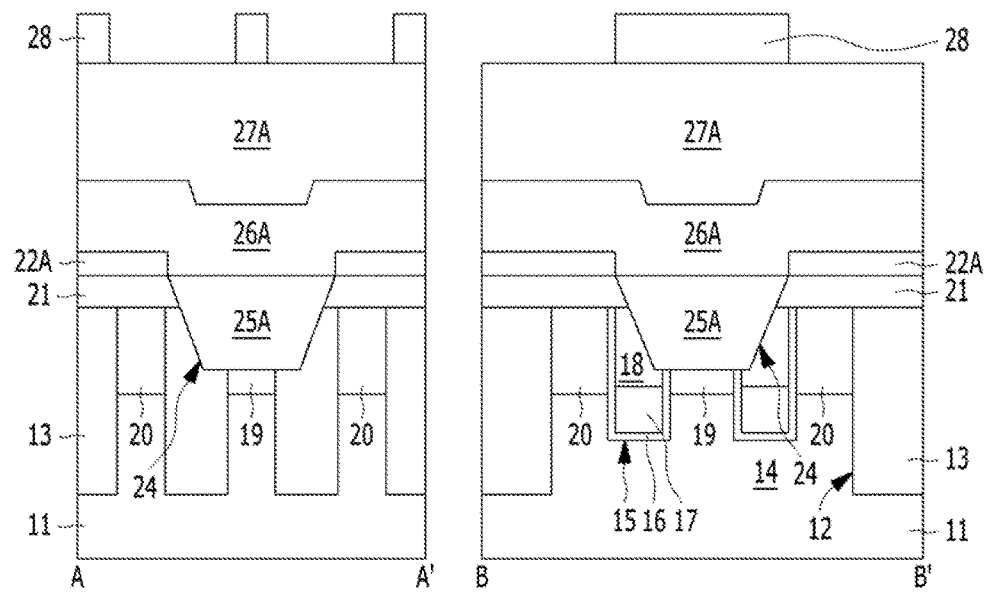

As illustrated in FIG. 3D, a conductive layer 26A and a bit line hard mask layer 27A may be stacked over the pre-first plug 25B shown in FIG. 3C and the etch stop layer 22A. The conductive layer 26A may be formed of a metal containing material. The conductive layer 26A may include metal, metal nitride, metal silicide, or a combination thereof. In the present embodiment, the conductive layer 26A may include tungsten or a stack structure of titanium nitride and tungsten. The conductive layer 26A may be formed by stacking a barrier layer and a metal layer. The barrier layer may prevent diffusion between the pre-first plug 25B and the metal layer. The bit line hard mask layer 27A may be formed of a dielectric material. The bit line hard mask layer 27A may include silicon oxide or silicon nitride. In the present embodiment, the bit line hard mask layer 27A may be formed of silicon nitride.

Then, a second mask pattern 28 may be formed over the bit line hard mask layer 27A. The second mask pattern 28 may include a photoresist pattern. The second mask pattern 28 may have a line shape extended in any one direction. The second mask pattern 28 may have a line width smaller than the diameter of the first opening 24.

Figure 3E:
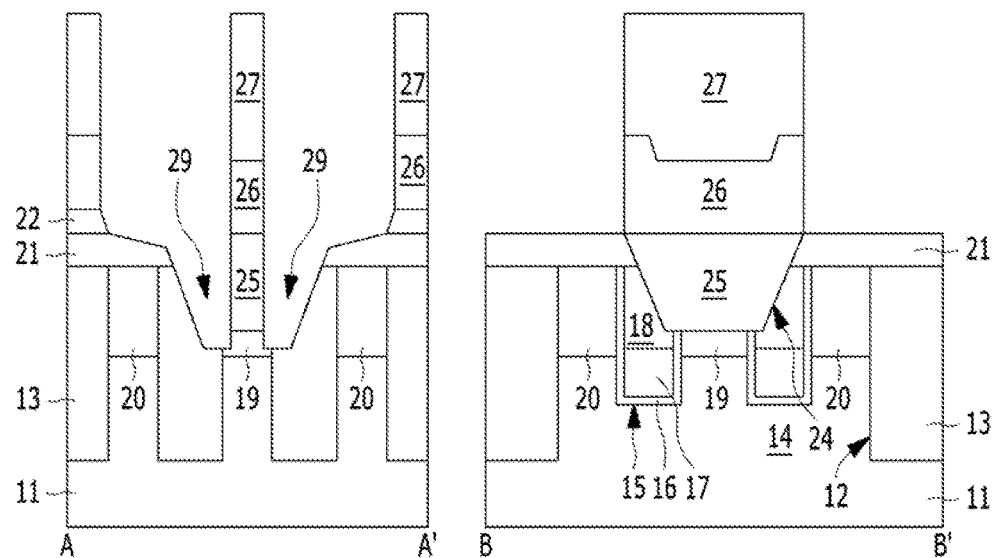

As illustrated in FIG. 3E, a bit line structure may be formed. The bit line hard mask layer 27A and the conductive layer 26A may be etched using the second mask pattern 28 as an etch mask. Thus, a bit line 26 and a bit line hard mask 27 may be formed. The process of etching the conductive layer 26A to form the bit line 26 may be stopped at the etch stop layer 22A. The bit line hard mask 27 may be formed by etching the bit line hard mask layer 27A.

The etch stop layer 22A may be etched using the second mask pattern 28 as an etch mask. The etch stop layer 22A may also be etched to have the same line width as the bit line 26. The remaining etch stop layer may be denoted by the reference numeral 22.

The pre-first plug 25B may be etched using the second mask pattern 28 as an etch mask. Thus, the first plug 25 may be formed. The pre-first plug 25B may be etched to have the same line width as the bit line 26. The first plug 25 may be formed over the first impurity region 19. The first plug 25 may connect the first impurity region 19 and the bit line 26 to each other. The first plug 25 may be formed in the first opening 24. The first plug 25 may have a line width smaller than the diameter of the first opening 24. Thus, a gap 29 may be formed at both sides of the first plug 25. In the direction in which the bit line 26 extends, the gap 29 may not be formed around the first plug 25. That is, the gap 29 may not overlap the bit line 26. Then, the second mask pattern 28 may be removed.

As the first plug 25 is formed as described above, the gap 29 may be formed in the first opening 24. This is due to the first plug 25 is etched to have a line width smaller than the diameter of the first opening 24. The gap 29 may not be formed in a shape surrounding the first plug 25, but independently formed at both sidewalls of the first plug 25. As a result, the one first plug 25 and the pair of gaps 29 may be positioned in the first opening 24, and the pair of gaps 29 may be isolated from each other by the first plug 25.

The bit line 26 may be extended in any one direction while covering the first plug 25. For example, the bit line 26 may be extended in a direction crossing the buried wordline 17. The bit line 26 may be extended in a line shape over the etch stop layer 22, and a part of the bit line 26 may be connected to the first plug 25. The bit line 26 may be electrically coupled to the first impurity region 19 through the first plug 25.

While the first plug 25 is formed, the element isolation layer 13 and the sealing layer 18 around the first plug 25 may be over-etched. Although not illustrated, a non-buried gate-type transistor including a planar gate structure may be formed in the peripheral circuit region after the bit line 26 and the first plug 25 are formed or when the bit line 26 and the first plug 25 are formed.

The planar gate structure may include a first electrode, a second electrode, and a gate hard mask. The first electrode may be formed by etching the conductive layer used as the pre-first plug 25B, and the second electrode may be formed by etching the conductive layer 26A used as the bit line 26. The gate hard mask may be formed by etching the bit line hard mask layer 27A.

After the planar gate structure is formed, a source region and a drain region may be formed in the substrate 11 of the peripheral circuit region. As a result, the non-buried gate-type transistor may be formed in the peripheral circuit region. The buried wordline 17, the first impurity region 19, and the second impurity region 20 may be formed in the cell region of the substrate 11. As described above, the bit line structure may be formed in the cell region at the same time when the planar gate structure is formed in the peripheral region.

Figure 3F:
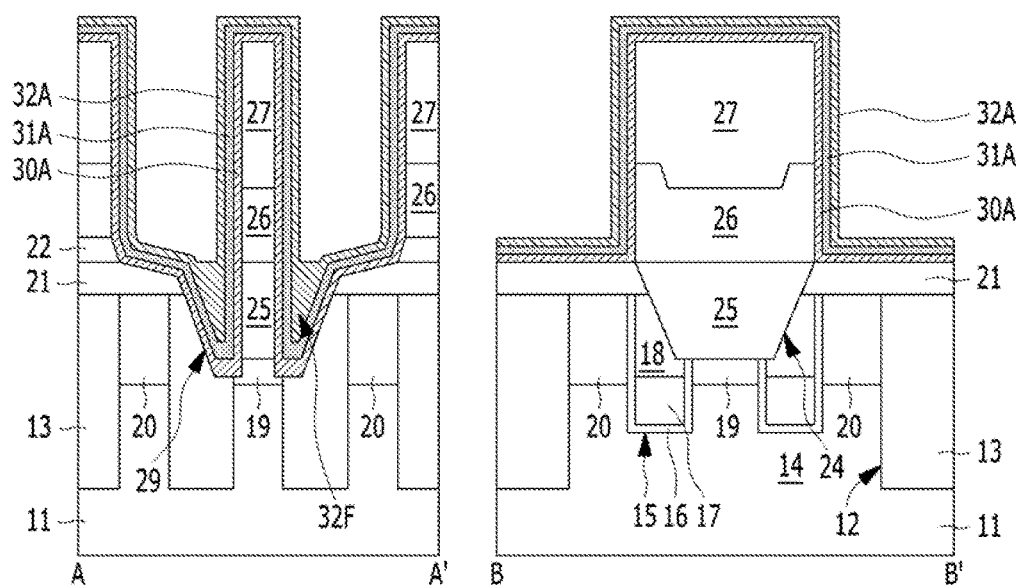

As illustrated in FIG. 3F, a first spacer layer 30A may be formed over the bit line structure. The first spacer layer 30A may be formed on the entire surface of the substrate 11 including the bit line structure. The first spacer layer 30A may be formed of a low-k dielectric material to reduce parasitic capacitance. The first spacer layer 30A may include silicon oxide or silicon nitride. In the present embodiment, the first spacer layer 30A may be formed of silicon nitride. The first spacer layer 30A may be conformally formed so as not to fill the gap 29. The first spacer layer 30A may protect the bit line 26 and the first plug 25 from a subsequent process. The first spacer layer 30A may be formed through ALD or CVD.

A first sacrificial spacer layer 31A may be formed over the first spacer layer 30A. The first sacrificial spacer layer 31A may be formed of a dielectric material. The first sacrificial spacer layer 31A may be formed of a material having an etching selectivity with respect to the first spacer layer 30A. The first sacrificial spacer layer 31A may include oxide. In the present embodiment, the first sacrificial spacer layer 31A may include silicon oxide. The first sacrificial spacer layer 31A may be conformally formed over the first spacer layer 30A so as not to fill the gap 29. The first sacrificial spacer layer 31A may be formed to have a smallest thickness as possible. For example, the first sacrificial spacer layer 31A may have a thickness which can sufficiently secure the size of the air gap even though the size of the first opening 24 is reduced.

A second spacer layer 32A may be formed over the first sacrificial spacer layer 31A. The second spacer layer 32A may be formed of a dielectric material. The second spacer layer 32A may be formed of a material having an etching selectivity with respect to the first sacrificial spacer layer 31A. The second spacer layer 32A may include nitride. In the present embodiment, the second spacer layer 32A may silicon nitride. The second spacer layer 32A may be formed over the first sacrificial spacer layer 31A while having a thickness to fill the gap 29. For example, a part of the second spacer layer 32A may serve as a filler portion 32F to fill the gap.

As such, the gap 29 may be filled with the first spacer layer 30A, the first sacrificial spacer layer 31A, and the second spacer layer 32A. The second spacer layer 32A may have a larger thickness than the first spacer layer 30A or the first sacrificial spacer layer 31A.

Figure 3G:
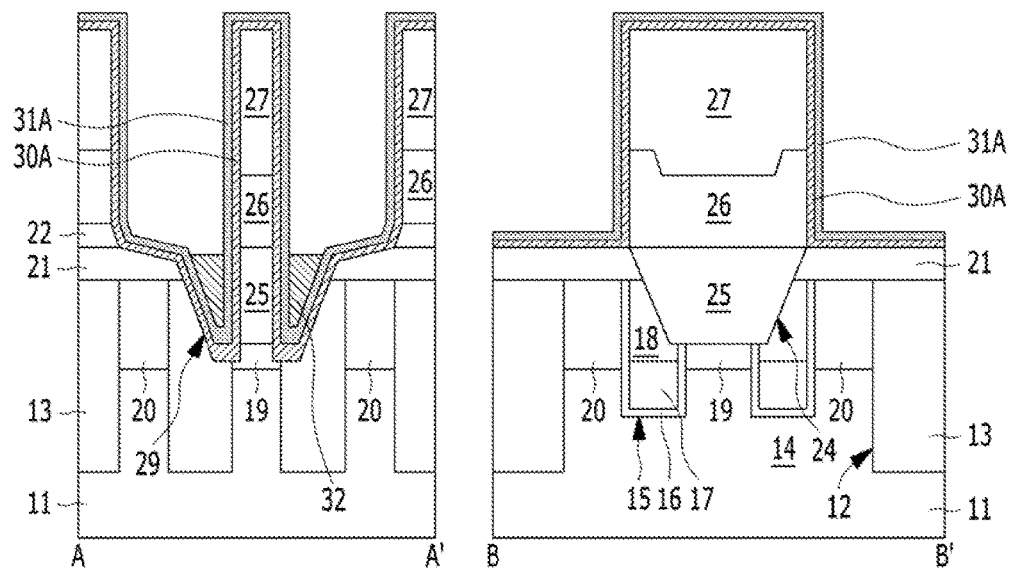

As illustrated in FIG. 3G, a filler 32 may be formed. The filler 32 may be formed through a trimming etch process against the second spacer layer 32A. The second spacer layer 32A may be trimmed through an etch back process. The filler 32 may be formed on the first sacrificial spacer layer 31A at the sidewalls of the first plug 25. The height of the filler 32 may be controlled so that the filler 32 is positioned in the gap 29. That is, the second spacer layer 32A located at a level higher than an upper surface of the first interlayer dielectric layer 21 and located at a level higher than the gap 29 may be removed. The first sacrificial spacer layer 31A may be partially exposed by the filler 32. When the filler 32 includes silicon nitride, the filler 32 may be referred to as a 'silicon nitride plug.'

Figure 3H:
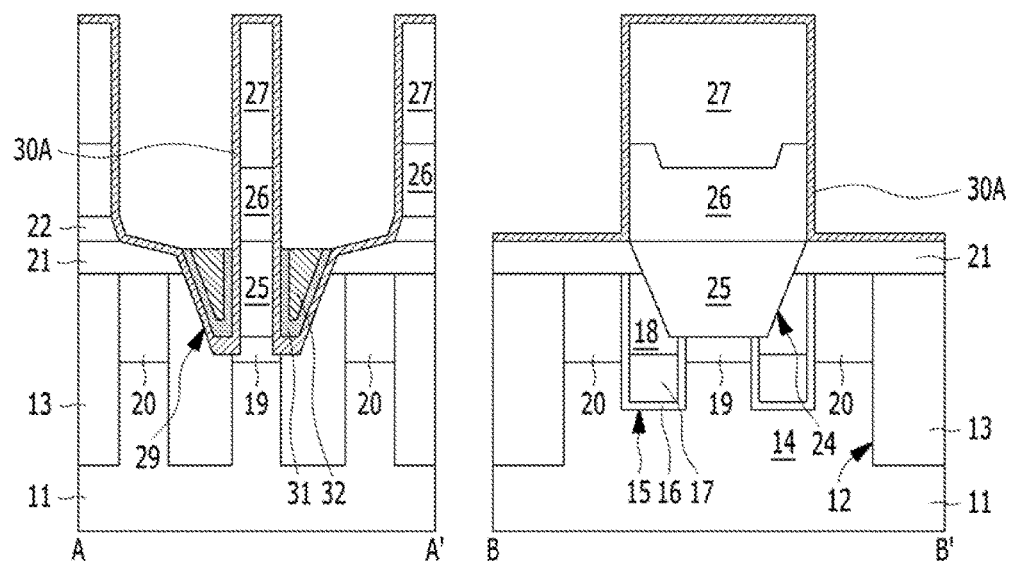

As illustrated in FIG. 3H, a sacrificial liner 31 may be formed. The sacrificial liner 31 may be formed through a trimming etch process for the first sacrificial spacer layer 31A. The first sacrificial spacer layer 31A may be trimmed through an etch back process. The sacrificial liner 31 may be formed on the first spacer layer 30A and at the sidewalls of the first plug 25. The height of the sacrificial liner 31 may be controlled so that the sacrificial liner 31 remains in the gap 29. That is, the first sacrificial spacer layer 31A located at a level higher than an upper surface of the first interlayer dielectric layer 21 and located at a level higher than the gap 29 may be removed. The first spacer layer 30A may be partially exposed by the sacrificial liner 31. As such, the sacrificial liner 31 and the filler 32 may be left in the gap 29.

Figure 3I:
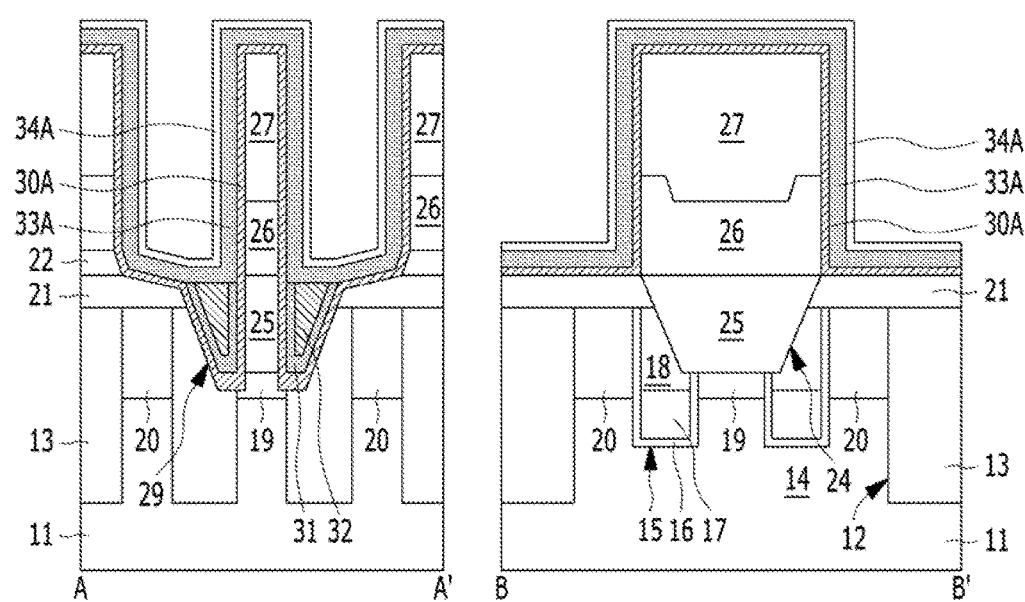

As illustrated in FIG. 3I, a plurality of spacer layers may be formed. The spacer layers may be formed on the entire surface of the resultant structure including the sacrificial liner 31 and the filler 32. The plurality of spacer layers may include a second sacrificial spacer layer 33A and a third sacrificial spacer layer 34A. The second sacrificial spacer layer 33A may be formed of a material having an etching selectivity with respect to the first spacer layer 30A and the filler 32. The second sacrificial spacer layer 33A may include oxide. In the present embodiment, the second sacrificial spacer layer 33A may include silicon oxide.

The third sacrificial spacer layer 34A may be formed of a material having an etching selectivity with respect to the second sacrificial spacer layer 33A. The third sacrificial spacer layer 34A may include nitride. In the present embodiment, the third sacrificial spacer layer 34A may include silicon nitride.

The second sacrificial spacer layer 33A and the third sacrificial spacer layer 34A may be conformally formed. The second sacrificial spacer layer 33A may have a larger thickness than the sacrificial liner 31. Thus, the line-shaped air gap and the plug-shaped air gap may have different sizes. For example, when the second sacrificial spacer layer 33A and the sacrificial liner 31 are removed to form the line-shaped air gap and the plug-shaped air gap during a subsequent process, the line-shaped air gap has a larger size than the plug-shaped air gap since the second sacrificial spacer layer 33A has a larger thickness than the sacrificial liner 31.

Figure 4A:
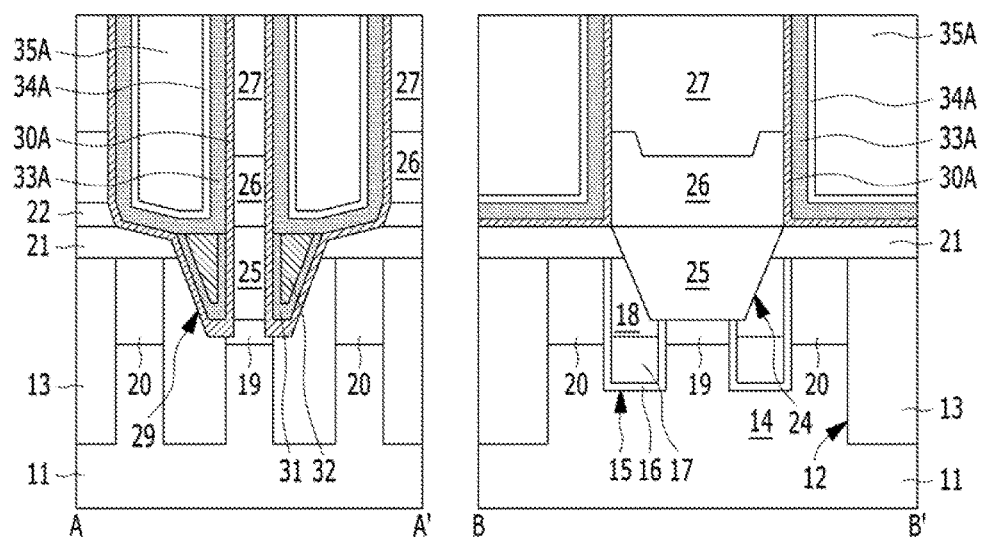
FIGS. 4A to 4N are diagrams for describing a storage node contact plug fabrication part.
Figure 4B:
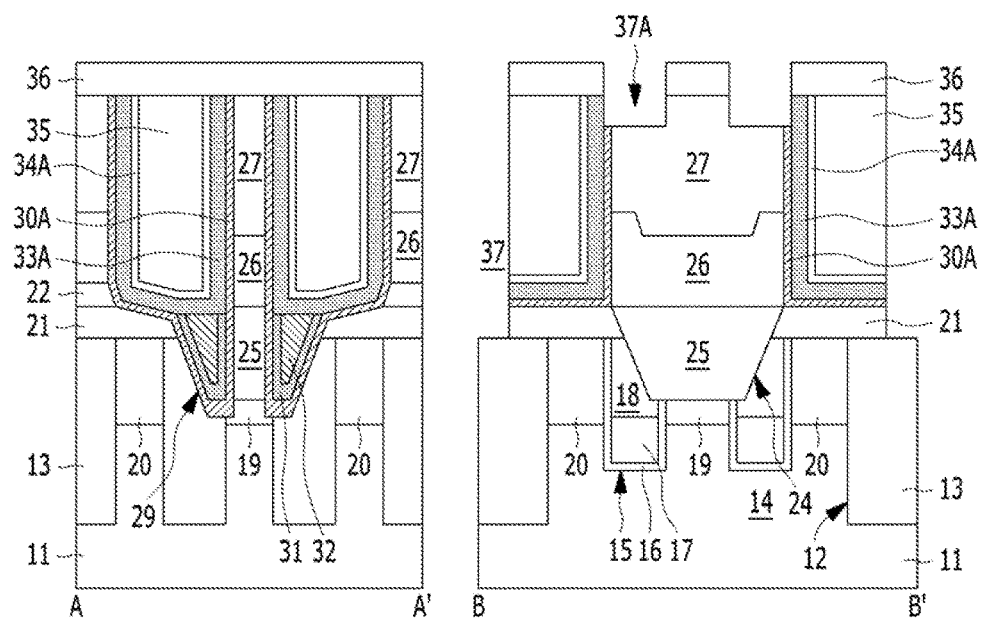
Figure 4C:
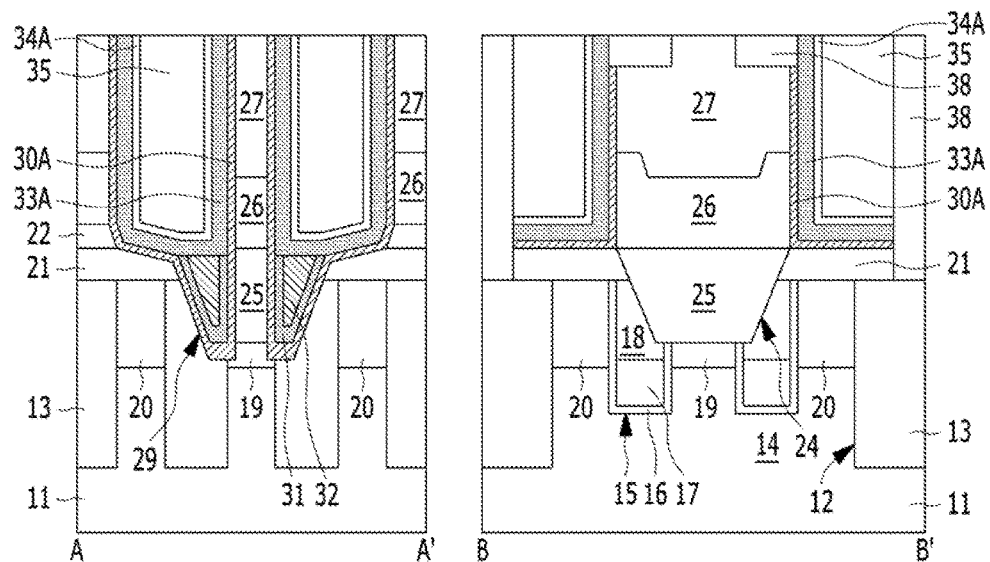
Figure 4D:
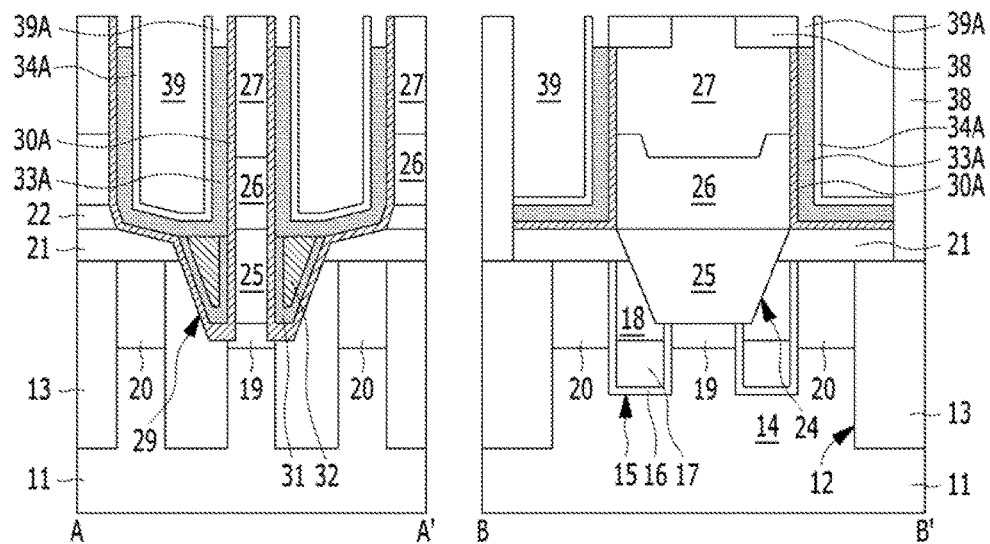
Figure 4E:
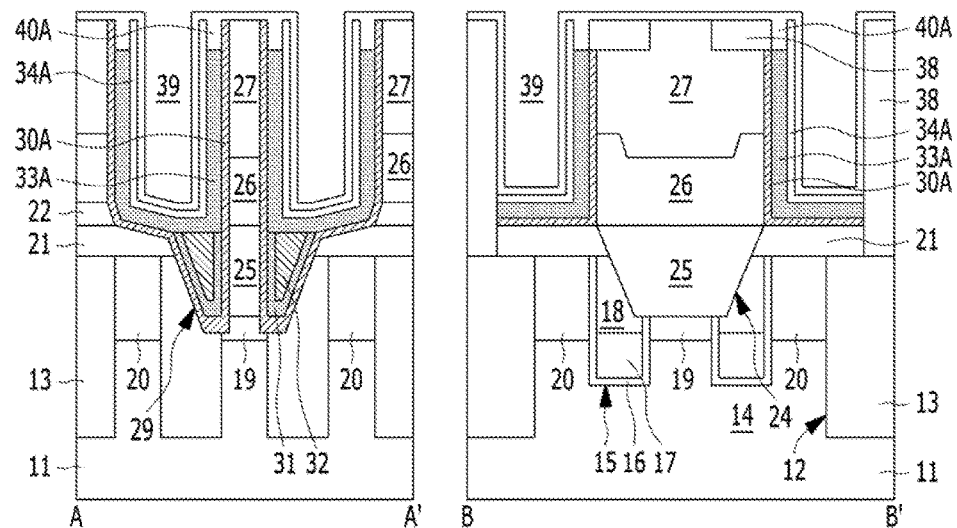
Figure 4F:
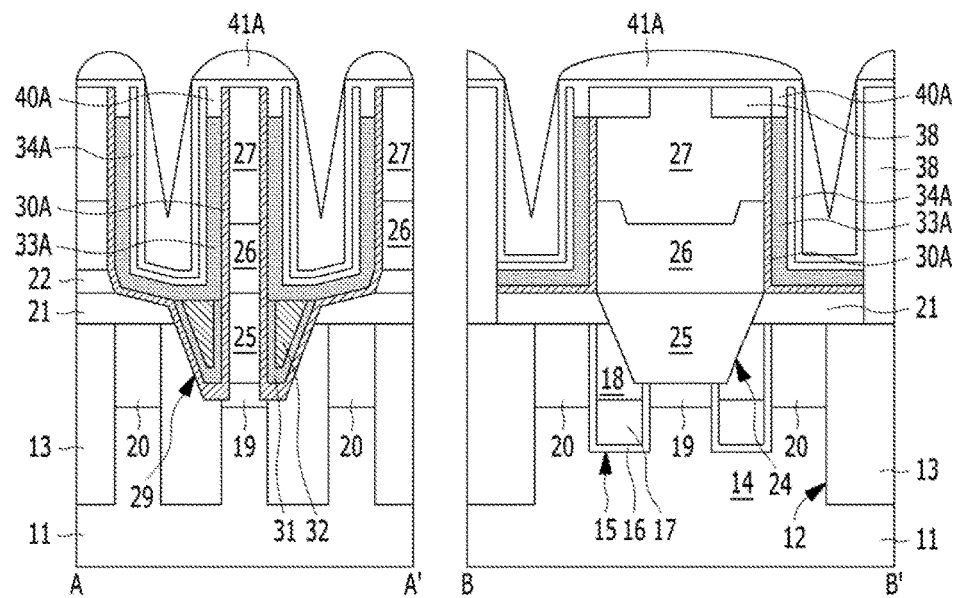
Figure 4G:
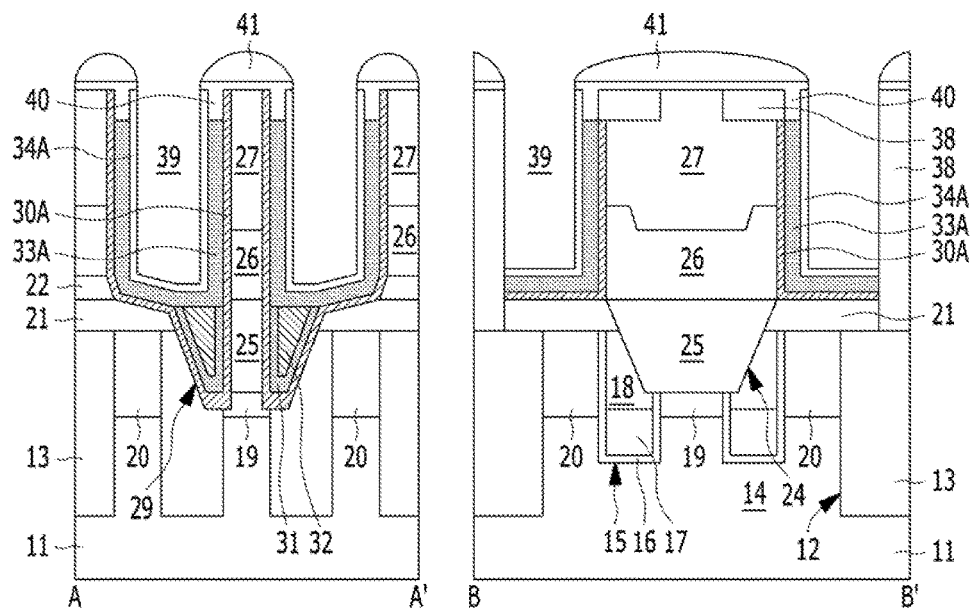
Figure 4H:
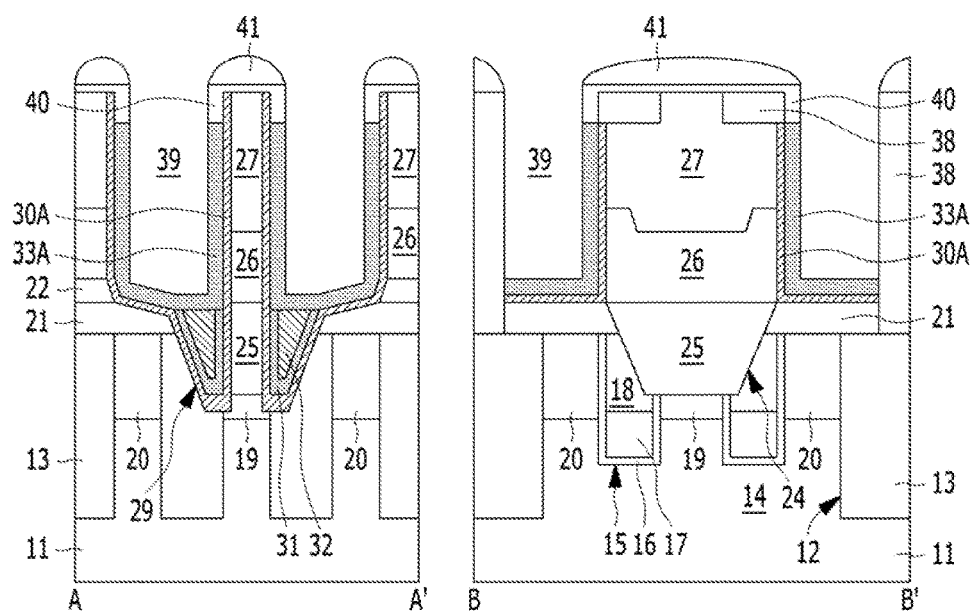
Figure 4I:
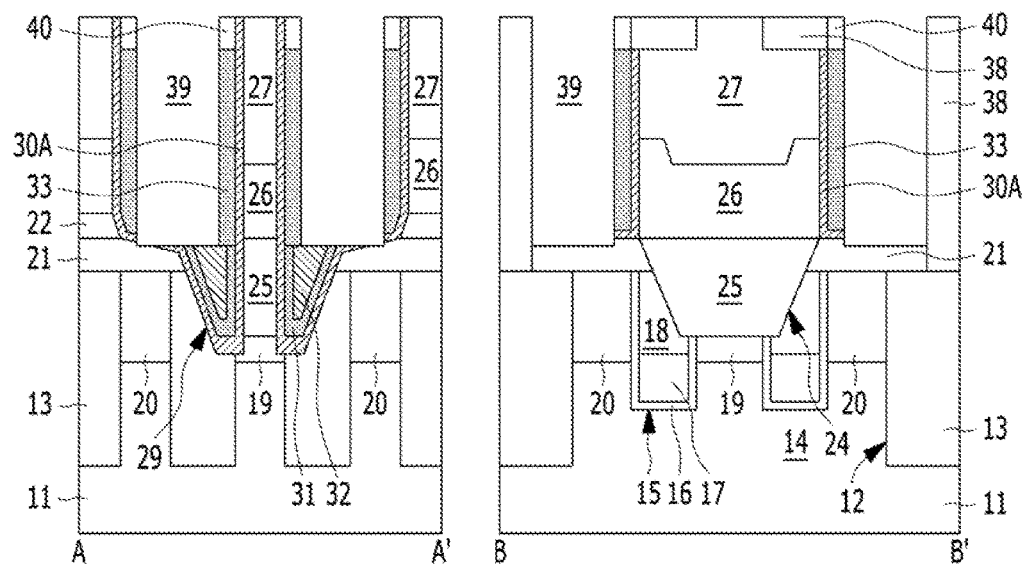
Figure 4J:
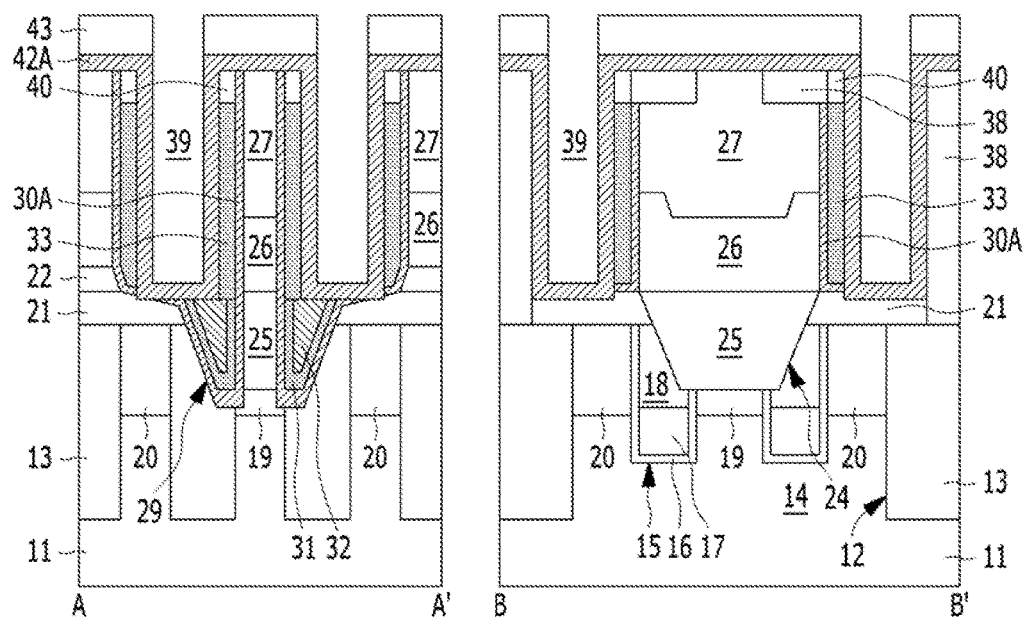
Figure 4K:
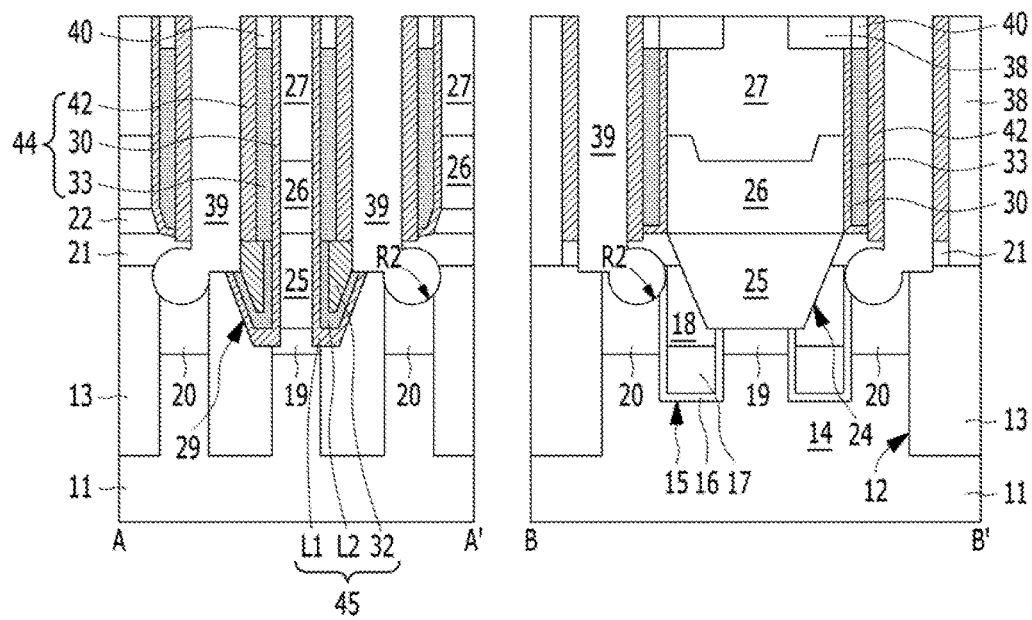
Figure 4L:
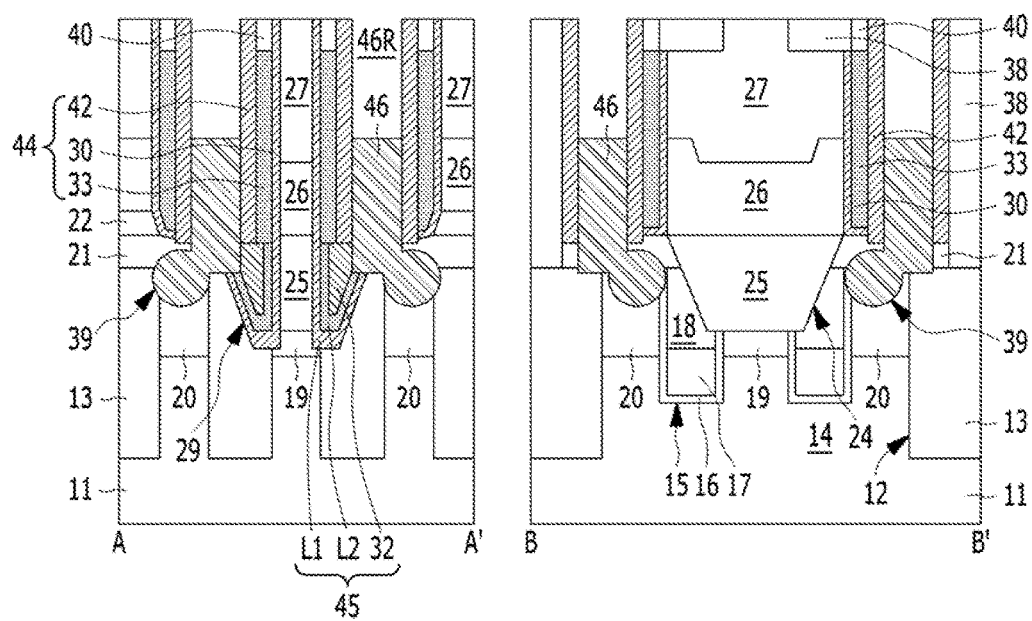
Figure 4M:
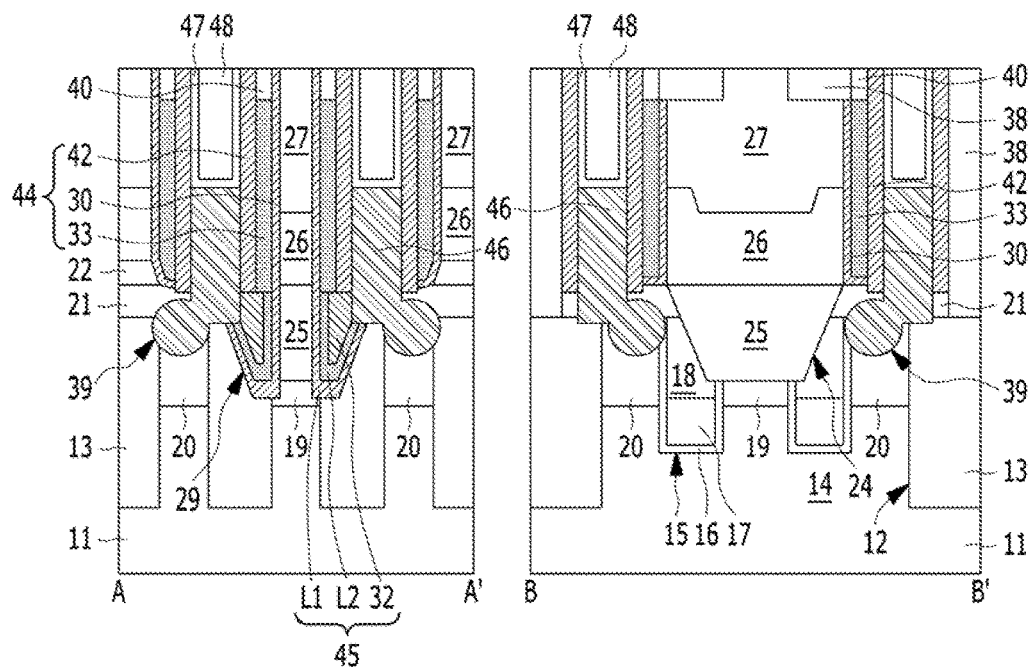
Figure 4N:
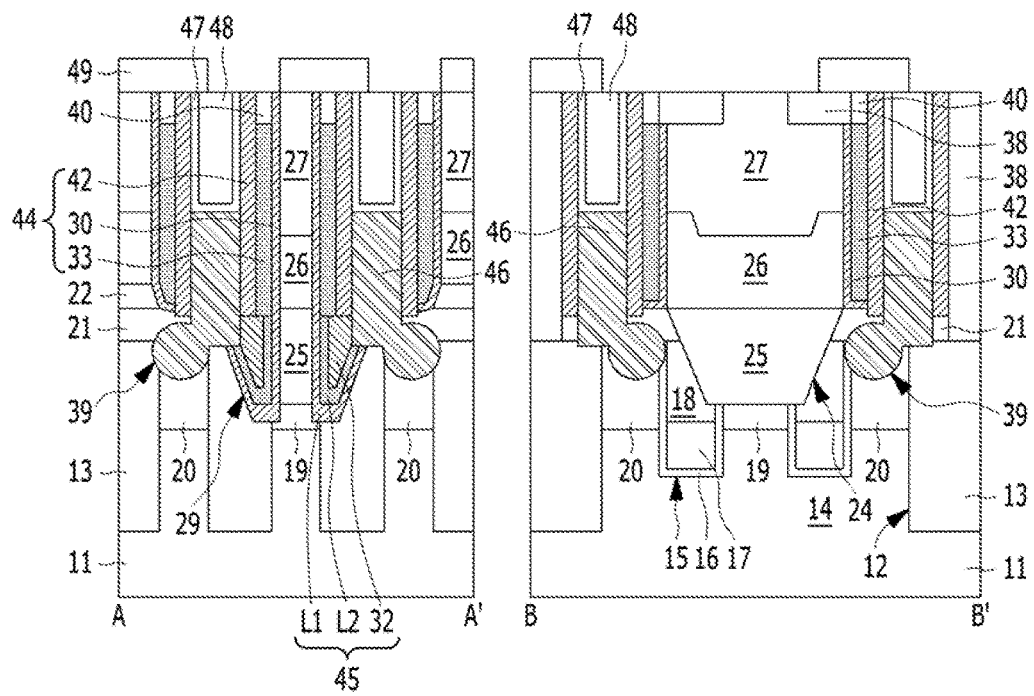

FIGS. 4A to 4N are diagrams for describing the storage node contact plug fabrication part. As illustrated in FIG. 4A, a sacrificial layer 35A may be formed. The sacrificial layer 35A may be buried between the adjacent bit lines 26. The sacrificial layer 35A may include silicon oxide. The sacrificial layer 35A may include a Spin-On Dielectric ("SOD") material. The sacrificial layer 35A may be planarized to expose the top surface of the bit line hard mask 27. Thus, the line-shaped sacrificial layer 35A may be formed between the bit lines 26. The sacrificial layer 35A may be extended in parallel to the bit line 26. During the planarization process for the sacrificial layer 35A, the first spacer layer 30A, the second sacrificial spacer layer 33A, and the third sacrificial spacer layer 34A over the top surface of the bit line hard mask 27 may be planarized.

As illustrated in FIG. 4B, a third mask pattern 36 may be formed. The third mask pattern 36 may be patterned in the direction intersecting the bit line 26. The third mask pattern 36 may have a line shape. The third mask pattern 36 may include a photoresist pattern.

A pre-isolation part 37 may be formed in the sacrificial layer pattern 35. The sacrificial layer 35A may be etched using the third mask pattern 36 as an etch mask. Thus, the pre-isolation part 37 may be formed, and the sacrificial layer pattern 35 may be left between the adjacent pre-isolation parts 37.

When the sacrificial layer 35A is etched, the upper part of the bit line structure may be etched to a predetermined depth. That is, the bit line hard mask 27 may be etched to a predetermined depth. Thus, the sacrificial layer 35A exposed by the third mask pattern 36 may be completely etched, and the bit line hard mask 27 may be partially etched. As a result, the pre-isolation part 37 may have a line shape intersecting the bit line structure. A part 37A of the pre-isolation part 37 may be positioned in the bit line structure and have a predetermined depth. The depth of the part 37A of the pre-isolation part 37 may be controlled so as not to expose the bit line 26. The pre-isolation part 37 may have a shape overlapping the buried wordline 17. In another embodiment, the pre-isolation part 37 may have a smaller line width than the buried wordline 17.

As illustrated in FIG. 4C, the third mask pattern 36 may be removed. A plug isolation layer 38 may be formed in the pre-isolation part 37. The plug isolation layer 38 may be formed by gap-filling silicon nitride in the pre-isolation part 37 and planarizing the silicon nitride. The plug isolation layer 38 may have a line shape extending in the direction intersecting the bit line structure. The sacrificial layer pattern 35 may be left in a space between the plug isolation layer 38 and the bit line structure. The plug isolation layer 38 may fill the part 37A of the pre-isolation part 37, as well.

As illustrated in FIG. 4D, the sacrificial layer pattern 35 may be removed. The space from which the sacrificial layer pattern 35 is removed may serve as a second opening 39. The second opening 39 may be formed between the plug isolation layer 38 and the bit line structure. The second opening 39 may be isolated from the bit line structure.

In order to remove the sacrificial layer pattern 35, a dip-out process may be applied. Through the dip-out process, the sacrificial layer pattern 35 may be selectively removed without a loss of the first spacer layer 30A and the third sacrificial spacer layer 34A. The second opening 39 may have a rectangular hole shape when seen from the top. When the sacrificial layer pattern 35 is removed, the second sacrificial spacer layer 33A may be partially removed. Thus, a recess 39A having a small width may be formed over the second sacrificial spacer layer 33A.

As illustrated in FIG. 4E, a re-capping layer 40A may be formed. The re-capping layer 40A may fill the recess 39A having a small width. The re-capping layer 40A may be formed of silicon oxide.

As illustrated in FIG. 4F, a first buffer layer 41A may be formed. The first buffer layer 41A may be formed of silicon oxide. As the first buffer layer 41A is formed, a loss of the bit line hard mask 27 may be prevented during a subsequent process of trimming nitride and etching oxide. The first buffer layer 41A may be formed on the entire surface of the resultant structure while covering the re-capping layer 40A. The first buffer layer 41A may have poor step coverage. During a subsequent process, the first buffer layer 41A and the re-capping layer 40A may serve as a material for protecting the bit line hard mask 27.

As illustrated in FIG. 4G, a first buffer layer pattern 41 may be formed. The first buffer layer pattern 41 may be formed by cleaning the first buffer layer 41A. For example, the first buffer layer 41A may be cleaned through a wet cleaning process. After the first buffer layer 41A is cleaned, the re-capping layer 40A may be etched back. Thus, a re-capping layer pattern 40 may be formed under the first buffer layer pattern 41. The third sacrificial spacer layer 34A may be exposed by the re-capping layer pattern 40.

As illustrated in FIG. 4H, the third sacrificial spacer layer 34A may be trimmed. Thus, as the third sacrificial spacer layer 34A is completely removed, the second sacrificial spacer layer 33A thereunder may be exposed. When the third sacrificial spacer layer 34A is trimmed, the bit line hard mask 27 may be protected by the first buffer layer pattern 41 and the re-capping layer pattern 40.

As illustrated in FIG. 4I, a second sacrificial spacer 33 may be formed. The second sacrificial spacer 33 may be formed by etching the second sacrificial spacer layer 33A. The second sacrificial spacer 33 may be discontinuous between the adjacent bit lines 26. When the second sacrificial spacer layer 33A is etched, the materials thereunder may be partially etched. However, when the second sacrificial spacer layer 33A is etched, the bit line hard mask 27 may be protected by the first buffer layer pattern 41 and the re-capping layer pattern 40. While the second sacrificial spacer layer 33A is completely etched, the first buffer layer pattern 41 may be also completely etched. At this time, the bit line hard mask 27 may be protected by the re-capping layer pattern 40. The re-capping layer pattern 40 may be positioned over the second sacrificial spacer 33 while exposing the top surface of the bit line hard mask 27.

As illustrated in FIG. 4J, a second spacer layer 42A may be formed. The second spacer layer 42A may be formed of a material having an etching selectivity with respect to the second sacrificial spacer 33. The second spacer layer 42A may include silicon nitride.

The second buffer layer pattern 43 may be formed over the second spacer layer 42A. The second buffer layer pattern 43 may be formed by depositing a second buffer layer and then cleaning the second buffer layer, like the first buffer layer pattern 41. The second buffer layer pattern 43 may include a material having an etching selectivity with respect to silicon oxide and silicon nitride. The second buffer layer pattern 43 may include metal nitride, unlike the first buffer layer pattern 41. The second buffer layer pattern 43 may include titanium nitride. The second buffer layer pattern 43 may serve as a material for protecting the bit line hard mask 27 during a subsequent process.

As illustrated in FIG. 4K, a second spacer 42 may be formed. The second spacer 42 may be formed by etching back the second spacer layer 42A. The second spacer 42 may have the shape of surrounding the sidewalls of the second opening 39.

Then, an etch process may be performed to expose the second impurity region 20. This process may be referred to as an expansion process for the second opening 39. For example, the lower materials self-aligned with the second spacer 42 and exposed by the second spacer 42 may be etched.

For example, while the first interlayer dielectric layer 21 is etched, the first spacer layer 30A, the sacrificial liner 31, and the filler 32 which are positioned in the gap 29 may be partially etched. During the etching process, the second buffer layer pattern 43 may serve as an etch mask. In another embodiment, while the expansion process is performed, the second buffer layer pattern 43 may be completely etched, as well. Through the expansion process, the bottom part of the second opening 39 may be expanded to expose the second impurity region 20. Subsequently, the second impurity region and the element isolation layer 13 may be partially recessed to a predetermined depth. The bottom part of the second opening 39 may have a curved profile R2 due to an etching selectivity difference.

As the bottom part of the second opening 39 is expanded, a spacer structure 44 including the first spacer 30, the second sacrificial spacer 33, and the second spacer 42 may be formed at the sidewalls of the bit line 26 and the first plug 25. The bottom part of the second sacrificial spacer 33 may be sealed by the sacrificial liner 31 and the filler 32. The top part of the second sacrificial spacer 33 may be exposed to the outside.

A dielectric plug 45 may be formed at both sidewalls of the first plug 25. The dielectric plug 45 may include the first spacer 30, the sacrificial liner 31, and the filler 32. The second sacrificial spacer 33 may have a larger width than the sacrificial liner 31. Hereafter, the first spacer 30 and the sacrificial liner 31 which are included in the dielectric plug 45 may be referred to as a first liner L1 and a second liner L2, respectively. The filler 32 may correspond to the filler F of FIG. 2A.

As illustrated in FIG. 4L, a second plug 46 may be formed. The second plug 46 may be recessed (46R) in the second opening 39. The second plug 46 may include a silicon containing layer. The second plug 46 may include a polysilicon layer. The polysilicon layer may be doped with an impurity. The second plug 46 may be connected to the second impurity region 20. The top surface of the second plug 46 may be positioned at a higher level than the top surface of the bit line 26. In order to form the second plug 46, a polysilicon layer may be deposited and an etch back process may be performed.

As illustrated in FIG. 4M, a barrier 47 and a third plug 48 may be formed. The barrier 47 and the third plug 48 may be buried over the second plug 46. The barrier 47 may prevent diffusion between the third plug 48 and the second plug 46. The barrier 47 may include titanium nitride. The third plug 48 may include a low-resistance material. The third plug 48 may include a metal containing layer. The third plug 48 may include tungsten.

Although not illustrated, an ohmic contact layer may be formed between the barrier 47 and the second plug 46. The ohmic contact layer may include metal silicide. In order to form ah ohmic contact layer, a silicidable metal layer may be deposited and annealed. Thus, at the interface between the silicidable metal layer and the second plug 46, silicidation may occur to form a metal silicide layer. The ohmic contact layer may include cobalt silicide. In the present embodiment, the ohmic contact layer may include cobalt silicide of $CoSi_2$. When the cobalt silicide of $CoSi_2$ is formed as the ohmic contact layer, contact resistance may be improved, and low-resistance cobalt silicide may be formed.

As illustrated in FIG. 4N, a pad 49 may be formed. The pad 49 may include a metal containing layer. The pad 49 may include tungsten. A part of the pad 49 may overlap the top of the third plug 48. The other part of the pad 49 may overlap the bit line hard mask 27. The pad 49 may have an extension which overlaps the bit line structure.

Figure 5A:
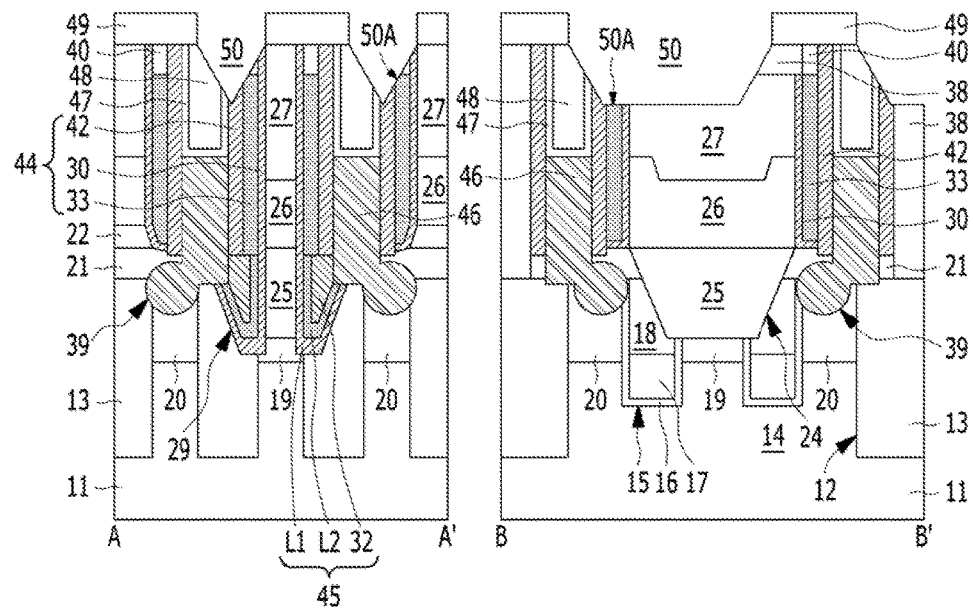
FIGS. 5A to 5D are diagrams for describing an air gap fabrication part.

FIGS. 5A to 5D are diagrams for describing the air gap fabrication part. As illustrated in FIG. 5A, an over-etch process may be performed to expose the second sacrificial spacer 33. For example, the materials under the pad 49 may be etched using the pad 49 as an etch mask. Thus, an over-etched portion 50 may be formed, and the second sacrificial spacer 33 may be exposed by the over-etched portion 50 (refer to reference numeral 50A). In another embodiment, the over-etched portion 50 may be formed through the etch process for forming the pad 49. For example, after forming the pad 49, the third plug 48, the barrier 47, the second spacer 42, the first spacer 30, the second sacrificial spacer 33, the re-capping layer pattern 40, and the bit line hard mask 27 are etched to a predetermined depth so that the third plug 48, the barrier 47, the second spacer 42, the first spacer 30, the second sacrificial spacer 33, the re-capping layer pattern 40, and the bit line hard mask 27 may be self-aligned with an edge of the pad 49.

Figure 5B:
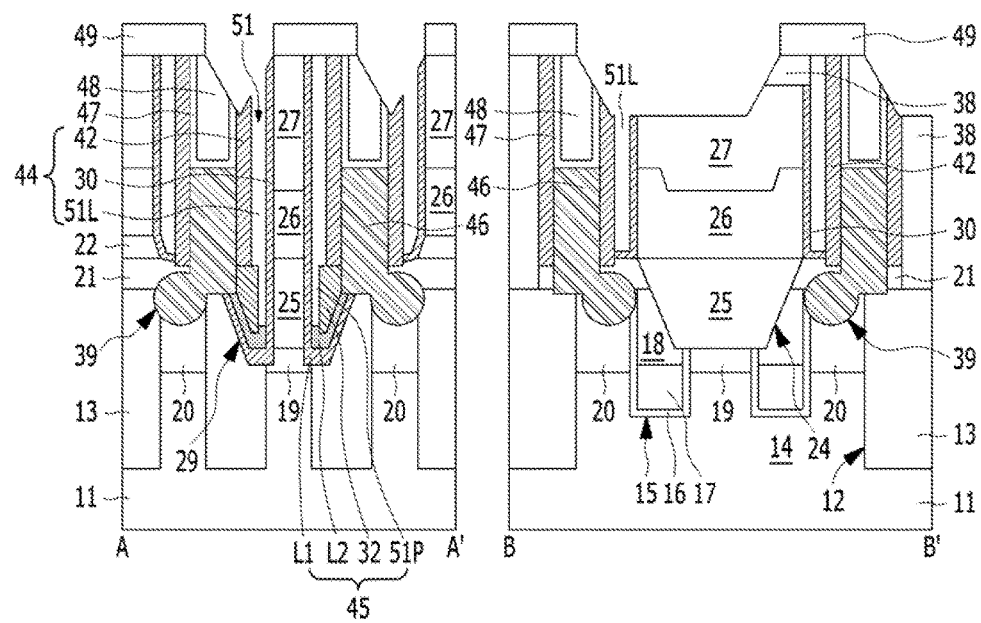

As illustrated in FIG. 5B, the second sacrificial spacer 33 may completely removed, and the second liner L2 may be partially removed. Thus, the space created by removing the second sacrificial spacer 33 and the space created by partially removing the second liner L2 may remain as an air gap 51. In order to remove the second sacrificial spacer 33, a wet etch process may be applied. For example, a chemical capable of selectively removing silicon oxide may be used. The chemical may flow to the surroundings of the first plug and remove a part of the second liner L2 while removing all of the second sacrificial spacer 33. Since the element isolation layer 13 is blocked by the first liner L1, the element isolation layer 13 may not be damaged by the chemical. While the second sacrificial spacer 33 and the second liner L2 are removed, all of the re-capping layer pattern 40 may be removed.

The air gap 51 may include a line-shaped air gap 51L and a plug-shaped air gap 51P. The line-shaped air gap 51L may be positioned between the first and second spacers 30 and 42. The line-shaped air gap 51L may be extended in parallel to the bit line 26. The plug-shaped air gap 51P may be formed at the sidewalls of the first plug 25. The line-shaped air gap 51L and the plug-shaped air gap 51P may be connected to each other. The plug-shaped air gap 51P may be independently formed at the sidewalls of the first plug 25. The line-shaped air gap 51L and the plug-shaped air gap 51P may have different sizes.

As described above, the air gap 51 including the line-shaped air gap 51L and the plug-shaped air gap 51P may be formed. A spacer structure including the first spacer 30 and the line-shaped air gap 51L may be formed at the sidewalls of the bit line 26. The second spacer 42 may have the shape of surrounding the sidewalls of the second plug 46. Between the bit line 26 and the second plug 46, the spacer structure 44 including the first spacer 30, the line-shaped air gap 51L, and the second spacer 42 may be positioned. At the sidewalls of the first plug 25, the dielectric plug 45 may be formed, which includes the first liner L1, the second liner L2, the plug-shaped air gap 51P, and the filler 32. Since the first and second spacers 30 and 42 include silicon nitride, a NAN (N-Air-N) structure may be formed between the bit line 26 and the second plug 46. The bottom part of the plug-shaped air gap 51P may be sealed by the first liner L1, the second liner L2, and the filler 32. The top part of the line-shaped air gap 51L may be exposed to the outside.

Since the second liner L2 has a smaller thickness than the second sacrificial spacer 33, the second liner L2 may be partially removed. The remaining second liner L2 may partially line the first liner L1. The second liner L2 may be positioned between the dielectric plug 45 and the second plug 46. Thus, while the air gap 51 is formed, the second liner L2 may prevent the second plug 46 from being exposed. Therefore, the second liner L2 may prevent a loss of the second plug 46, which can be caused by the chemical. In a comparative example, when wet etching is performed for a long time in order to remove all of the second liner L2, the first liner L1 and the filler F may be damaged to cause a bridge between the second plug 46 and the first plug 25.

Since sacrificial materials, which have different thicknesses and are discontinuous from each other, are removed to form the line-shaped air gap 51L and the plug-shaped air gap 51P, the size of the air gap 51 may be secured and prevent an attack to adjacent structures. Furthermore, although the size of the first opening 24 is reduced in response to high integration, the size of the air gap 51 may be sufficiently secured. For example, although the size of the plug-shaped air gap 51P is reduced, the size of the line-shaped air gap 51L can be sufficiently increased. Thus, the total size of the air gap 51 may be easily controlled.

Figure 5C:
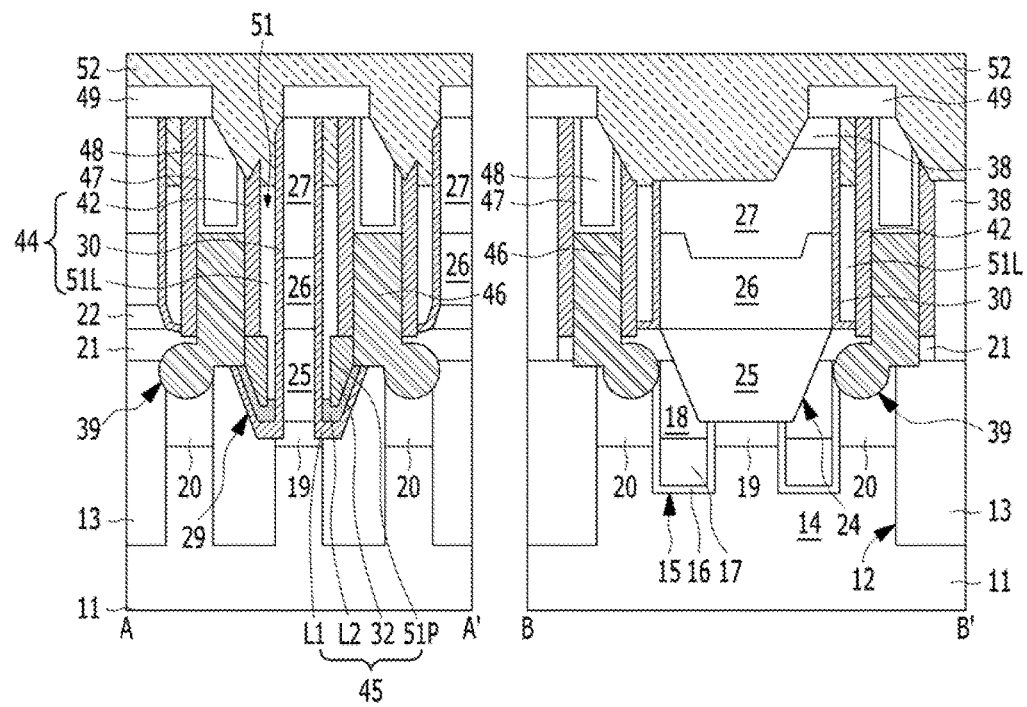

As illustrated in FIG. 5C, a capping layer 52 may be formed. The capping layer 52 may fill the top part of the air gap 51. The capping layer 52 may include silicon oxide, silicon nitride, or a combination thereof. The bottom part of the capping layer 52 may have a depth sufficient to secure the height of the air gap 51 between the bit line 26 and the second plug 46. In order to form the capping layer 52, silicon nitride may be deposited on the entire surface of the resultant structure so as to fill the top part of the air gap 51, and an etch back process may be then performed. In order to selectively fill only the top part of the air gap 51, silicon nitride may be deposited so that the deposited layer has poor step coverage characteristics. For example, silicon nitride may be deposited by Plasma CVD ("PCVD"). Since the width of the air gap 51 is very small, the silicon nitride may not be deposited to the bottom of the air gap 51.

Figure 5D:
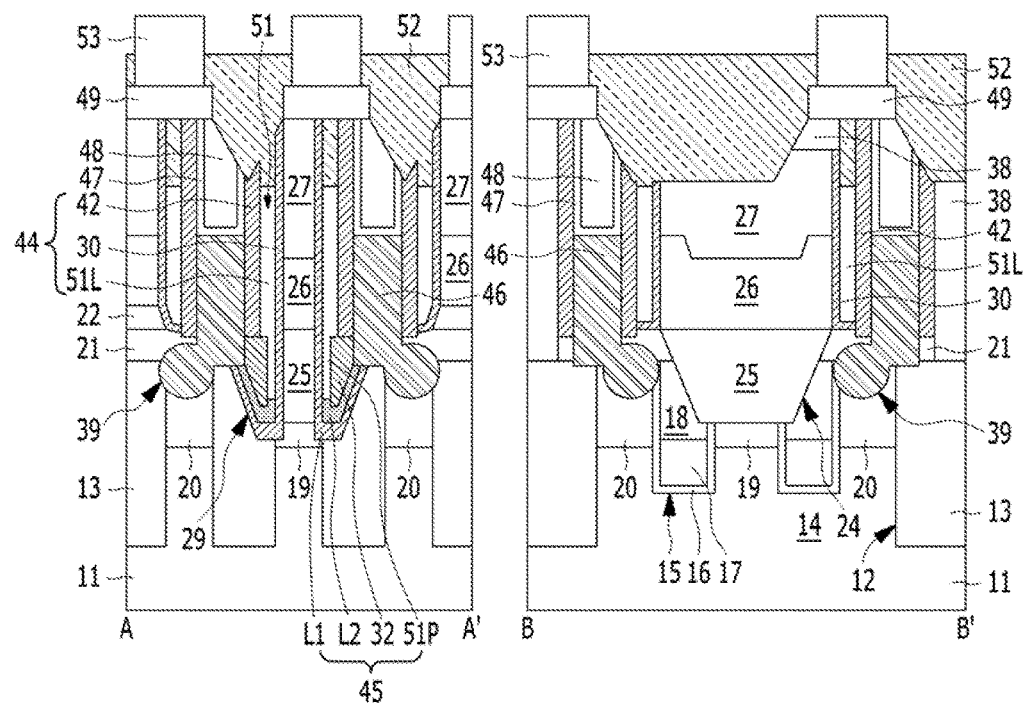

As illustrated in FIG. 5D, a memory element 53 may be formed to be electrically coupled to the pad 49. In accordance with the above-described embodiment, the plug-shaped air gap 51P may be formed between the first plug 25 and the second plug 46 at the same time as the line-shaped air gap 51L is formed between the second plug 46 and the bit line 26. Thus, parasitic capacitance may be reduced. Since parasitic capacitance is reduced, a sensing margin may be improved.

The semiconductor device in accordance with the embodiment of the present invention may be applied to Dynamic Random Access Memory (DRAM). The semiconductor device is not limited thereto, but may be applied to Static Random Access Memory (SRAM), Flash Memory, Ferroelectric Random Access Memory (FeRAM), Magnetic Random Access Memory (MRAM), Phase Change Random Access Memory (PRAM), etc. For example, when the second plug is adjacent between the conductive structures including the conductive line on the first plug, the plug-shaped air gap may be formed between the first and second plugs, and the line-shaped air gap may be formed between the conductive line and the second plug.

In accordance with the embodiment of the present invention, the air gap may be formed between the bit line contact plug and the storage node contact plug at the same time as the air gap is formed between the bit line and the storage node contact plug, thereby reducing parasitic capacitance. Thus, the operating speed of the memory cell can be improved.

Furthermore, since the line-shaped air gap and the plug-shaped air gap are formed by removing sacrificial materials which have different thicknesses and are discontinuous, the size of the air gap can be sufficiently secured.

Furthermore, although the size of the line-shaped air gap can be sufficiently increased even though the size of the plug-shaped air gap is reduced in response to high integration, the total size of the air gap can be easily controlled.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   a substrate having first and second surfaces;
   an interlayer dielectric layer formed over the first surface and having a first opening to expose the first surface;
   a first plug positioned in the first opening;
   a bit line extending in a first direction and covering the first plug;
   a second plug comprising a lower part and an upper part, wherein the lower part is at the same level as the first plug, wherein the upper part is at the same level as the bit line;
   a first air gap positioned between the first plug and the lower part of the second plug; and
   a second air gap positioned between the bit line and the upper part of the second plug,
   wherein the second air gap has a larger width than the first air gap.

2. The semiconductor device of claim 1,
   wherein the second air gap has a line shape extending in the first direction.

3. The semiconductor device of claim 1, further comprising:
   a plug isolation layer extending in a direction intersecting the bit line and providing a second opening which is adjacent to the bit line and the first plug and exposes the second surface,
   wherein the second plug is positioned in the second opening.

4. The semiconductor device of claim 1, further comprising:
   a first spacer formed at both sidewalls of the bit line; and
   a second spacer surrounding a sidewall of the second plug,
   wherein the second air gap is positioned between the first spacer and the second spacer, and
   wherein the second air gap has a line shape extending in parallel to a sidewall of the first spacer.

5. The semiconductor device of claim 4, further comprising:
   a capping layer formed over the second air gap.

6. The semiconductor device of claim 5, wherein each of the first spacer, the second spacer, and the capping layer comprises silicon nitride.

7. The semiconductor device of claim 1, further comprising:
   a third plug over the second plug; and
   a barrier between the second and third plugs.

8. The semiconductor device of claim 7, further comprising:
   a pad formed over the third plug,
   wherein the pad partially overlaps the third plug.

9. The semiconductor device of claim 8, further comprising:
   a memory element formed over the pad.

10. The semiconductor device of claim 1, further comprising:
    a buried wordline formed in the substrate and extends in a direction intersecting the bit line.

* * * * *